US012562350B2

(12) United States Patent
Kimball et al.

(10) Patent No.: US 12,562,350 B2
(45) Date of Patent: Feb. 24, 2026

(54) MOVEABLE EDGE RINGS FOR PLASMA PROCESSING SYSTEMS

(71) Applicant: LAM RESEARCH CORPORATION, Fremont, CA (US)

(72) Inventors: Christopher Kimball, San Jose, CA (US); Darrell Ehrlich, San Jose, CA (US); Yuma Ohkura, San Mateo, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 382 days.

(21) Appl. No.: 18/029,708

(22) PCT Filed: Sep. 29, 2021

(86) PCT No.: PCT/US2021/052732
§ 371 (c)(1),
(2) Date: Mar. 31, 2023

(87) PCT Pub. No.: WO2022/076227
PCT Pub. Date: Apr. 14, 2022

(65) Prior Publication Data
US 2023/0369026 A1     Nov. 16, 2023

Related U.S. Application Data

(60) Provisional application No. 63/087,814, filed on Oct. 5, 2020.

(51) Int. Cl.
*H01J 37/32* (2006.01)
*H01L 21/687* (2006.01)

(52) U.S. Cl.
CPC .. *H01J 37/32642* (2013.01); *H01J 37/32651* (2013.01); *H01L 21/68735* (2013.01); *H01L 21/68742* (2013.01)

(58) Field of Classification Search
CPC .......... H01J 37/32642; H01J 37/32651; H01L 21/68735; H01L 21/68742
See application file for complete search history.

(56) References Cited

U.S. PATENT DOCUMENTS

| | | | |
|---|---|---|---|
| 5,529,657 A | 6/1996 | Ishii | |
| 5,569,350 A | 10/1996 | Osada et al. | |

(Continued)

FOREIGN PATENT DOCUMENTS

| | | | |
|---|---|---|---|
| CN | 1189859 A | 8/1998 | |
| CN | 1682344 A | 10/2005 | |

(Continued)

OTHER PUBLICATIONS

Decision to Grant for Japanese Application No. 2022-557679 dated Feb. 28, 2024.

(Continued)

*Primary Examiner* — Wyatt A Stoffa
*Assistant Examiner* — Christopher J Gassen

(57) ABSTRACT

A moveable edge ring system for a substrate processing system includes a top moveable ring including a first annular body arranged around a substrate support. The top moveable ring is exposed to plasma during substrate processing. A moveable support ring is arranged below the top moveable ring and radially outside of a baseplate of the substrate support and includes a second annular body. A shield ring is arranged radially outside of the moveable support ring and includes a third annular body. A cover ring includes a fourth annular body arranged above a radially outer edge of the top moveable ring. An actuator and a lift pin are configured to adjust a position of the top moveable ring and the moveable support ring relative to the shield ring and the cover ring.

45 Claims, 15 Drawing Sheets

(56) References Cited

U.S. PATENT DOCUMENTS

| | | | |
|---|---|---|---|
| 5,837,058 A | 11/1998 | Chen et al. |
| 6,511,543 B1 | 1/2003 | Stauss et al. |
| 6,896,765 B2 | 5/2005 | Steger |
| 9,698,042 B1 | 7/2017 | Baldasseroni et al. |
| 11,798,789 B2 | 10/2023 | Sanchez et al. |
| 2002/0053513 A1 | 5/2002 | Stimson et al. |
| 2002/0092602 A1 | 7/2002 | Saito et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0061447 A1 | 3/2005 | Kim et al. |
| 2005/0067021 A1 | 3/2005 | Bevers et al. |
| 2005/0082007 A1 | 4/2005 | Nguyen et al. |
| 2005/0133164 A1 | 6/2005 | Fischer et al. |
| 2005/0155625 A1 | 7/2005 | Jangjian et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0060141 A1 | 3/2006 | Kamaishi et al. |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2006/0283551 A1 | 12/2006 | Son |
| 2007/0023398 A1 | 2/2007 | Kobayashi et al. |
| 2007/0024077 A1 | 2/2007 | McClintock |
| 2007/0026684 A1 | 2/2007 | Parascandola et al. |
| 2007/0066038 A1 | 3/2007 | Sadjadi et al. |
| 2007/0131350 A1 | 6/2007 | Ricci et al. |
| 2007/0158025 A1 | 7/2007 | Larson |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0208427 A1 | 9/2007 | Davidson et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0283882 A1 | 12/2007 | Cho et al. |
| 2007/0284344 A1 | 12/2007 | Todorov et al. |
| 2008/0014347 A1 | 1/2008 | Power |
| 2008/0072823 A1 | 3/2008 | Yudovsky et al. |
| 2008/0101978 A1 | 5/2008 | Ryabova et al. |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0174387 A1 | 7/2008 | Chiang |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2008/0261800 A1 | 10/2008 | Yuan et al. |
| 2008/0314508 A1 | 12/2008 | Ricci et al. |
| 2008/0317564 A1 | 12/2008 | Cheng et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0078196 A1 | 3/2009 | Midorikawa |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0163037 A1 | 6/2009 | Miya et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1 | 8/2009 | Koelmel et al. |
| 2009/0221117 A1 | 9/2009 | Tan et al. |
| 2009/0236313 A1 | 9/2009 | Qiu et al. |
| 2009/0272717 A1 | 11/2009 | Pamarthy et al. |
| 2009/0279989 A1 | 11/2009 | Wong et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0059181 A1 | 3/2010 | Lee et al. |
| 2010/0071438 A1 | 3/2010 | Davis et al. |
| 2010/0108261 A1 | 5/2010 | Augustino et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0197070 A1 | 8/2010 | Stoddard et al. |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1 | 2/2011 | Kobayashi |
| 2011/0094596 A1 | 4/2011 | Sugiyama et al. |
| 2011/0108524 A1 | 5/2011 | Dhindsa et al. |
| 2011/0126984 A1 | 6/2011 | Kang et al. |
| 2011/0135821 A1 | 6/2011 | Ding |
| 2011/0157760 A1 | 6/2011 | Willwerth et al. |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0176692 A1 | 7/2012 | Yamawaku et al. |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |

(56) References Cited

U.S. PATENT DOCUMENTS

| | | |
|---|---|---|
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0135058 A1 | 5/2013 | Long et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0313785 A1 | 11/2013 | Otschik et al. |
| 2013/0334038 A1 | 12/2013 | Riker et al. |
| 2014/0017900 A1 | 1/2014 | Doba et al. |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1 | 8/2014 | McMillin et al. |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0107773 A1 | 4/2015 | Shintaku et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0099162 A1 | 4/2016 | Ng et al. |
| 2016/0111258 A1 | 4/2016 | Taskar et al. |
| 2016/0172165 A1 | 6/2016 | Jeon et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2016/0307742 A1 | 10/2016 | Mishra et al. |
| 2016/0372321 A1 | 12/2016 | Krishnan et al. |
| 2017/0011892 A1 | 1/2017 | Guo et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0043527 A1 | 2/2017 | Uttaro |
| 2017/0062769 A1 | 3/2017 | Kim et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0113355 A1 | 4/2017 | Genetti et al. |
| 2017/0115657 A1 | 4/2017 | Trussell et al. |
| 2017/0125274 A1 | 5/2017 | Swaminathan et al. |
| 2017/0133283 A1 | 5/2017 | Kenworthy |
| 2017/0200586 A1 | 7/2017 | Treadwell et al. |
| 2017/0213751 A1 | 7/2017 | Oohashi |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1 | 2/2018 | Zhang et al. |
| 2018/0138069 A1 | 5/2018 | Tan et al. |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |
| 2018/0358211 A1 | 12/2018 | Mun |
| 2019/0013232 A1 | 1/2019 | Yan et al. |
| 2019/0027988 A1 | 1/2019 | Filipenko et al. |
| 2019/0279888 A1 | 9/2019 | Gopalakrishnan et al. |
| 2019/0363003 A1 | 11/2019 | Sarode Vishwanath |
| 2020/0004954 A1 | 1/2020 | Zawadowskiy et al. |
| 2020/0020565 A1 | 1/2020 | Rathnasinghe et al. |
| 2020/0049547 A1 | 2/2020 | Spyropoulos et al. |
| 2020/0234928 A1 | 7/2020 | Vishwanath |
| 2020/0234981 A1 | 7/2020 | Schmid et al. |
| 2020/0303224 A1 | 9/2020 | Yoshimori |
| 2020/0312633 A1 | 10/2020 | Rathnasinghe et al. |
| 2020/0328105 A1 | 10/2020 | Sun et al. |
| 2020/0395195 A1 | 12/2020 | Sanchez et al. |
| 2021/0057256 A1 | 2/2021 | Bergantz et al. |
| 2021/0066052 A1 | 3/2021 | Emura |
| 2021/0111007 A1 | 4/2021 | Kim et al. |
| 2021/0291374 A1 | 9/2021 | Bergantz et al. |
| 2021/0327688 A1 | 10/2021 | Sasaki et al. |
| 2021/0384013 A1 | 12/2021 | Jung et al. |
| 2022/0122878 A1 | 4/2022 | Wu et al. |
| 2022/0246408 A1 | 8/2022 | Genetti et al. |
| 2022/0319904 A1 | 10/2022 | Rice et al. |
| 2022/0359169 A1 | 11/2022 | Koai et al. |

FOREIGN PATENT DOCUMENTS

| | | |
|---|---|---|
| CN | 1701421 A | 11/2005 |
| CN | 101238553 A | 8/2008 |
| CN | 101552182 A | 10/2009 |
| CN | 102243977 A | 11/2011 |
| CN | 202076225 U | 12/2011 |
| CN | 102315150 A | 1/2012 |
| CN | 102610476 A | 7/2012 |
| CN | 103730318 A | 4/2014 |
| CN | 104205321 A | 12/2014 |
| CN | 104299929 A | 1/2015 |
| CN | 104752141 A | 7/2015 |
| CN | 104851832 A | 8/2015 |
| CN | 105336561 A | 2/2016 |
| CN | 105810609 A | 7/2016 |
| CN | 106469637 A | 3/2017 |
| CN | 107086168 A | 8/2017 |
| CN | 107093569 A | 8/2017 |
| CN | 107768275 A | 3/2018 |
| CN | 108369922 A | 8/2018 |
| CN | 112563108 A | 3/2021 |

(56) References Cited

FOREIGN PATENT DOCUMENTS

| | | | |
|---|---|---|---|
| CN | 212874484 | U | 4/2021 |
| EP | 0424299 | A2 | 4/1991 |
| EP | 0821403 | A2 | 1/1998 |
| EP | 0821404 | A2 | 1/1998 |
| EP | 0838842 | A2 | 4/1998 |
| EP | 0875919 | A2 | 11/1998 |
| EP | 0875979 | A1 | 11/1998 |
| EP | 1202328 | A2 | 5/2002 |
| JP | H0293063 | A | 4/1990 |
| JP | H07106316 | A | 4/1995 |
| JP | H07221024 | A | 8/1995 |
| JP | H10-280173 | A | 10/1998 |
| JP | 2000036488 | A | 2/2000 |
| JP | 20000124141 | A | 4/2000 |
| JP | 3076791 | B2 | 8/2000 |
| JP | 2001230239 | A | 8/2001 |
| JP | 2001522142 | A | 11/2001 |
| JP | 2002500439 | A | 1/2002 |
| JP | 2002503765 | A | 2/2002 |
| JP | 2002-176030 | A | 6/2002 |
| JP | 2002-217171 | A | 8/2002 |
| JP | 2002-231794 | A | 8/2002 |
| JP | 2003-513434 | A | 4/2003 |
| JP | 2004-266127 | A | 9/2004 |
| JP | 2004296553 | A | 10/2004 |
| JP | 2006173223 | A | 6/2006 |
| JP | 2006186171 | A | 7/2006 |
| JP | 2006-344701 | A | 12/2006 |
| JP | 2007207808 | A | 8/2007 |
| JP | 2007-234867 | A | 9/2007 |
| JP | 2007321244 | A | 12/2007 |
| JP | 2007535819 | A | 12/2007 |
| JP | 2008027936 | A | 2/2008 |
| JP | 2008159931 | A | 7/2008 |
| JP | 2008-244274 | A | 10/2008 |
| JP | 2008-251681 | A | 10/2008 |
| JP | 2010034416 | A | 2/2010 |
| JP | 2010267894 | A | 11/2010 |
| JP | 2011-54933 | A | 3/2011 |
| JP | 2011210853 | A | 10/2011 |
| JP | 2012-049376 | A | 3/2012 |
| JP | 201264671 | A | 3/2012 |
| JP | 2012507860 | A | 3/2012 |
| JP | 2012-146743 | A | 8/2012 |
| JP | 2012216614 | A | 11/2012 |
| JP | 2012222235 | A | 11/2012 |
| JP | 201342012 | A | 2/2013 |
| JP | 2013511847 | A | 4/2013 |
| JP | 2013526063 | A | 6/2013 |
| JP | 2013530516 | A | 7/2013 |
| JP | 2013172013 | A | 9/2013 |
| JP | 2014084523 | A | 5/2014 |
| JP | 2015109249 | A | 6/2015 |
| JP | 5767373 | B2 | 8/2015 |
| JP | 2015201552 | A | 11/2015 |
| JP | 2016046451 | A | 4/2016 |
| JP | 2016-146472 | A | 8/2016 |
| JP | 2016-219820 | A | 12/2016 |
| JP | 2017085072 | A | 5/2017 |
| JP | 2017092435 | A | 5/2017 |
| JP | 2017092448 | A | 5/2017 |
| JP | 2017131927 | A | 8/2017 |
| JP | 2017183701 | A | 10/2017 |
| JP | 2018010992 | A | 1/2018 |
| JP | 2018098239 | A | 6/2018 |
| JP | 2018125519 | A | 8/2018 |
| JP | 2018160666 | A | 10/2018 |
| JP | 2019505088 | A | 2/2019 |
| JP | 2019192734 | A | 10/2019 |
| JP | 2020043137 | A | 3/2020 |
| JP | 2020519016 | A | 6/2020 |
| JP | 2022031361 | A | 2/2022 |
| KR | 10-1998-0086673 | A | 12/1998 |
| KR | 20010112277 | A | 12/2001 |
| KR | 20020002704 | A | 1/2002 |
| KR | 20020031417 | A | 5/2002 |
| KR | 1020020031417 | A | 5/2002 |
| KR | 20020071398 | A | 9/2002 |
| KR | 20030065126 | A | 8/2003 |
| KR | 20040050080 | A | 6/2004 |
| KR | 20050008792 | A | 1/2005 |
| KR | 20050038898 | A | 4/2005 |
| KR | 100578129 | B1 | 5/2006 |
| KR | 20070073704 | A | 7/2007 |
| KR | 100783062 | B1 | 12/2007 |
| KR | 100803858 | B1 | 2/2008 |
| KR | 20080013552 | A | 2/2008 |
| KR | 20080023569 | A | 3/2008 |
| KR | 100849179 | B1 | 7/2008 |
| KR | 20090024075 | A | 3/2009 |
| KR | 20090080520 | A | 7/2009 |
| KR | 1020090080520 | A | 7/2009 |
| KR | 2010-0105695 | A | 9/2010 |
| KR | 20100123724 | A | 11/2010 |
| KR | 2011-0125188 | A | 11/2011 |
| KR | 20110123519 | A | 11/2011 |
| KR | 20110137775 | A | 12/2011 |
| KR | 20130124616 | A | 11/2013 |
| KR | 20130137962 | A | 12/2013 |
| KR | 20140001540 | A | 1/2014 |
| KR | 2014-0101870 | A | 8/2014 |
| KR | 2014-0103872 | A | 8/2014 |
| KR | 2014-0132542 | A | 11/2014 |
| KR | 10-2016-0063412 | A | 6/2016 |
| KR | 10-2016-0088820 | A | 7/2016 |
| KR | 20160088820 | A | 7/2016 |
| KR | 20170037526 | A | 4/2017 |
| KR | 20180099776 | A | 9/2018 |
| KR | 101927936 | B1 | 12/2018 |
| KR | 20190017721 | A | 2/2019 |
| KR | 20190026898 | A | 3/2019 |
| KR | 10-1974422 | B1 | 5/2019 |
| KR | 101974420 | B1 | 5/2019 |
| KR | 20190068490 | A | 6/2019 |
| TW | 506234 | B | 10/2002 |
| TW | 200302035 | A | 7/2003 |
| TW | 200520137 | A | 6/2005 |
| TW | 200525635 | A | 8/2005 |
| TW | I267563 | B | 12/2006 |
| TW | 201001588 | A | 1/2010 |
| TW | 201207933 | A | 2/2012 |
| TW | 201246327 | A | 11/2012 |
| TW | 201324653 | A | 6/2013 |
| TW | 201347063 | A | 11/2013 |
| TW | 201351532 | A | 12/2013 |
| TW | 201426854 | A | 7/2014 |
| TW | 201436089 | A | 9/2014 |
| TW | 201447965 | A | 12/2014 |
| TW | 201503209 | A | 1/2015 |
| TW | M492915 | U | 1/2015 |
| TW | 201528310 | A | 7/2015 |
| TW | 201532106 | A | 8/2015 |
| TW | 201601208 | A | 1/2016 |
| TW | 201626427 | A | 7/2016 |
| TW | 201630107 | A | 8/2016 |
| TW | 201639074 | A | 11/2016 |
| TW | 201719709 | A | 6/2017 |
| TW | 201737290 | A | 10/2017 |
| TW | 201817899 | A | 5/2018 |
| TW | 201926536 | A | 7/2019 |
| TW | 201935593 | A | 9/2019 |
| WO | WO-0040776 | A1 | 7/2000 |
| WO | WO-0113404 | A1 | 2/2001 |
| WO | WO-2007008509 | A2 | 1/2007 |
| WO | WO-2009086109 | A2 | 7/2009 |
| WO | WO-2011051251 | A1 | 5/2011 |
| WO | WO-2013108750 | A1 | 7/2013 |
| WO | WO-2013123617 | A1 | 8/2013 |
| WO | WO-2014068886 | A1 | 5/2014 |
| WO | WO-2014163742 | A1 | 10/2014 |
| WO | WO-2014209492 | A1 | 12/2014 |
| WO | WO-2017131927 | A1 | 8/2017 |
| WO | WO-2017155812 | A1 | 9/2017 |
| WO | WO-2018010986 | A1 | 1/2018 |

(56) References Cited

FOREIGN PATENT DOCUMENTS

| WO | WO-2019022707 A1 | 1/2019 |
| WO | WO-2019103722 A1 | 5/2019 |
| WO | WO-2019112903 A1 | 6/2019 |
| WO | WO-2019143858 A1 | 7/2019 |
| WO | WO-2020036613 A1 | 2/2020 |
| WO | WO-2020-180656 A1 | 9/2020 |
| WO | WO-2021025934 A1 | 2/2021 |
| WO | WO-2021026110 A1 | 2/2021 |
| WO | WO-2021030184 A1 | 2/2021 |
| WO | WO-2021-167897 A1 | 8/2021 |
| WO | WO-2021194470 A1 | 9/2021 |
| WO | WO-2022076227 A1 | 4/2022 |

OTHER PUBLICATIONS

European Examination Report for European Application No. 21161965.5 dated Jul. 27, 2023.
Extended European Search Report from European Application No. 22156901.5 dated Jun. 27, 2022.
First Office Action from Corresponding Taiwanese Application No. 109126470 dated Jun. 28, 2024.
Japanese Office Action and Search Report for Japanese Application No. 2022-508752 dated Jul. 25, 2024.
Korean Decision for Grant of Patent for Korean Application No. 10-2023-7035339 dated Jul. 30, 2024.
Office Action from corresponding Korean Application No. 10-2022-7007791, dated Jul. 22, 2024.
Chinese Office Action for Chinese Application No. 202080057245.1 dated Oct. 17, 2024.
Decision to Grant for Japanese Application No. 2023-11469 dated Apr. 10, 2024.
International Search Report and Written Opinion of the ISA issued in PCT/US2022/043617, mailed Mar. 30, 2023; ISA/KR.
Japanese Office Action for Japanese Application No. 2023-129731 dated Sep. 10, 2024.
Office Action from corresponding Chinese Application No. 202210228466.1, dated Oct. 30, 2024.
Office Action from corresponding Korean Application No. 10-2022-7007496, dated Aug. 21, 2024.
Office Action from corresponding Taiwanese Application No. 112149171, dated Nov. 13, 2024.
International Search Report and Written Opinion of the ISA issued in PCT/US2021/052732, mailed Jan. 21, 2022; ISA/KR.
U.S. Appl. No. 16/876,818, filed May 18, 2020, Haoquan Yan.
U.S. Appl. No. 16/487,703, filed Aug. 21, 2019, Hiran Rajitha Rathnasinghe.
U.S. Appl. No. 16/497,091, filed Sep. 24, 2019, Hiran Rajitha Rathnasinghe.
U.S. Appl. No. 17/631,984, filed Feb. 1, 2022, Hui Ling Han.
U.S. Appl. No. 17/633,727, filed Feb. 8, 2022, Rohini Mishra.
U.S. Appl. No. 17/671,211, filed Feb. 14, 2022, Christopher Kimball.
U.S. Appl. No. 17/681,606, filed Feb. 25, 2022, Hiran Rajitha Rathnasinghe.
U.S. Appl. No. 17/681,633, filed Feb. 25, 2022, Hiran Rajitha Rathnasinghe.
U.S. Appl. No. 17/913,008, filed Sep. 20, 2022, Hui Ling Han.
U.S. Appl. No. 18/377,141, filed Oct. 5, 2023, Alejandro Sanchez.
Blain (Mar./ Apr. 1999) "Mechanism of nitrogen removal from silicon nitride by nitric oxide," Journal of Vacuum Science & Technology A, 17(2):665-667.
Blain et al. (Jul./Aug. 1996) "Role of nitrogen in the downstream etching of silicon nitride," Journal of Vacuum Science & Technology A, 14(4):2151-2157.
Bohr, Mark, "The New Era of Scaling in an SoC World" Intel Logic Technology Development; ISSCC; 2009; 66 Pages.
Cashco, Inc. "Fluid Flow Basics of Throttling Valves." 1999. pp. 1-56. Available Mar. 24, 2020 online at: https://www.controlglobal.com/assets/Media/MediaManager/RefBook_ Cash co_Fluid. pdf. (Year: 1999).

Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
D. A. Jobson. "On the Flow of a Compressible Fluid through Orifices." Proceedings of the Institution of Mechanical Engineers. 169[1](1955). pp. 767-776. https://doi.org/10.1243/PIME_PROC_ 1955_169_077 _02 (Year: 1955).
Decision for Grant of Patent for Korean Application No. 10-2021-7014539 dated Feb. 23, 2022.
Dusa, Mircean et al., "Pitch Doubling Through Dual Patterning Lithography Challenges in Integration and Litho Budgets," Optical Microlithography XX, vol. 6520, 65200G, (2007); 10 pages.
European Extended Search Report dated Jun. 6, 2022 issued in EP 18929891.2.
European Extended Search Report dated May 30, 2016 issued in EP 15 199 363.1.
Examination Report issued in corresponding European Patent Application 18929891.2 dated Jul. 3, 2023.
First Chinese Office Action for Chinese Application No. 201710013856.6 dated Oct. 21, 2019.
First Chinese Office Action for Chinese Application No. CN201710076420.1 issued Dec. 17, 2019. No translation provided. 11 pages.
First Office Action corresponding to Chinese Patent Application No. 201710122891.1 dated Apr. 10, 2020, 14 pages.
First Office Action corresponding to Japanese Application No. 2016-004302, dated Jan. 28, 2020, 4 pages.
First Office Action corresponding to Japanese Application No. 2018-186353, dated Jan. 21, 2020, 8 pages.
First Office Action corresponding to Taiwanese Patent Application No. 106106790 dated Oct. 7, 2020, 7 pages.
First Office Action corresponding to Tiawanese Application No. 106104190, dated Sep. 4, 2020, 5 pages.
First Office Action dated Aug. 2, 2018 corresponding to Chinese Patent Application No. 201710036188.9, 7 pages.
First Office Action dated Dec. 29, 2017 corresponding to Chinese Patent Application No. 201610032252.1, 12 pages.
First Office Action dated Mar. 17, 2020 corresponding to Chinese Patent Application 20170076027.2, 8 pages.
First Office Action with Translation dated Oct. 7, 2021 corresponding to Japanese Patent Application No. 2017-154893, 7 pages.
First Office Action with Translation dated Sep. 7, 2021 corresponding to Korean Patent Application No. 10-2017-0083210, 6 pages.
International Search Report and the Written Opinion of the ISA issued in PCT/US2017/061080, mailed Feb. 22, 2018; ISA/KR.
International Search Report and Written Opinion issued in PCT/US2017/043527, mailed Apr. 20, 2018; ISA/KR.
International Search Report and Written Opinion issued in PCT/US2017/062769, mailed Aug. 21, 2018; ISA/KR.
International Search Report and Written Opinion of the ISA issued in PCT/US2018/050273, mailed May 13, 2019; ISA/KR.
International Search Report and Written Opinion of the ISA issued in PCT/US2020/024333, mailed Dec. 24, 2020; ISA/KR.
International Search Report and Written Opinion of the ISA issued in PCT/US2020/044168, mailed Nov. 17, 2020; ISA/KR.
International Search Report and Written Opinion of the ISA issued in PCT/US2020/045389, mailed Nov. 17, 2020; ISA/KR.
International Search Report and Written Opinon for PCT Applicaiton No. PCT/US2019/045085 dated Dec. 20, 2019.
Kastenmeier et al. (Nov./Dec. 1999) "Highly selective etching of silicon nitride over silicon and silicon dioxide," J. Vac. Sci. Techno!. A, American Vacuum Society, I7 (6):3179-3184.
Kastenmeier et al. (Sep./Oct. 1996) "Chemical dry etching of silicon nitride and silicon dioxide using CF4/02/N2 gas mixtures," J. Vac. Sci. Technol. A14(5):2802-2813.
Korean Notice of Preliminary Examination Result for Korean Application No. 10-2023-7037853 dated Dec. 6, 2023.
L. Jiang et al., 'Impact of Ar addition to inductively coupled plasma etching of SiC in SF6/O2', Microelectron. Eng., (Mar. 18, 2004).
Machine Translation of Notice of Reasons for Refusal corresponding to Japanese Patent Application No. 2019-559033 dated Dec. 22, 2020, 4 pages.

(56)          References Cited

OTHER PUBLICATIONS

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.

Notice of Reason for Refusal issued in corresponding Japanese patent application No. 2019-505020 dated Oct. 16, 2020.

Notice of Reason for Refusal issued in corresponding Japanese patent application No. 2019-505020 dated Oct. 20, 2020.

Notice of Reason for Refusal issued in corresponding Japanese patent application No. 2022-31361dated Jan. 17, 2023.

Notice of Reason for Refusal issued in corresponding Japanese patent application No. 2022-31361dated Jun. 20, 2023.

Notice of Reasons for Refusal for Japanese Application No. 2021-75777 dated Jul. 12, 2022.

Notification of Examination Opinions corresponding to Taiwanese Patent Application No. 10512352 dated Feb. 19, 2020, 5 pages.

Notification of Search Report corresponding to Singapore Patent Application No. 10201808035Y dated Oct. 20, 2022, 11 pages.

O.W. Purbo et al., 'Reactive Ion Etching of SOI (SIMOX and ZMR) Silicon in Nitrogen Containing $CF_4+O_2$ and $SF_6+O_2$ Plasmas', the J. Electrochem. Soc., (Sep. 30, 1993).

Oehrlein et al. (1996) "Study of plasma-surface interactions: chemical dry etching and high-density plasma etching," Plasma Sources Sci. Technol. 5:193-199.

Office Action dated Dec. 1, 2020 corresponding to Japanese Application No. 2019-553416, 4 pages.

Office Action dated May 29, 2023 from Korean Patent Office for Korean Patent Application No. 10-2021-0079769; 8 pages.

Office Action dated Oct. 10, 2023 from Korean Patent Office for Korean Patent Application No. 10-2023-7023024.

Office Action issued in corresponding Chinese Patent Application 201880002160.6 dated Mar. 23, 2023.

Office Action issued in corresponding Japanese Patent Application 2016-143886 dated Sep. 8, 2020.

Office Action issued in corresponding Japanese Patent Application 2022-31361 dated Jan. 17, 2023 (No English translation available).

Office Action issued in corresponding Korean Patent Application 1020170018561 mailed May 21, 2024.

Office Action issued in corresponding Korean Patent Application 10-2018-7028683 dated Dec. 29, 2022.

Office Action issued in corresponding Korean Patent Application 10-2018-7028683 dated May 2, 2023.

Office Action issued in corresponding Korean Patent Application 10-2021-7027521 dated Dec. 20, 2021.

Office Action issued in corresponding Korean Patent Application No. 1020170018549 dated May 28, 2024.

Office Action issued in corresponding Korean Patent Application No. 10-2018-7028683 dated Apr. 27, 2022 ..

Office Action issued in corresponding Korean Patent Application No. 10-2018-7028683 dated Dec. 29, 2022.

Office Action issued in corresponding Korean Patent Application No. 10-2018-7028683 dated Nov. 26, 2020.

Office Action issued in corresponding Taiwanese Patent Application 111104002 dated Mar. 6, 2023.

Office Action issued in corresponding Taiwanese Patent Application No. 10-2018-7028683 dated Nov. 26, 2020.

Office Action issued in corresponding Taiwanese Patent Application No. 109128923 dated May 11, 2021 (4 pages).

O'Keefe Controls Co. "Choked Flow of Gases." in Catalog 11. 2003. pp. 20-24 & 48. (Year: 2003).

Search Report dated Feb. 19, 2020 corresponding to European Application No. 17 932 862.0, 7 pages.

Search Report dated Sep. 7, 2020 corresponding to European Application No. 17 919 402.2, 9 pages.

Second Office Action corresponding to Chinese Patent Application No. 201710122891.1 dated Dec. 3, 2020, 5 pages.

Supplementary Partial European Search Report issued in corresponding European Patent Application No. 18929891 dated Mar. 18, 2022.

Supplementary Partial European Search Report issued in corresponding European Patent Application No. 20850609 dated Aug. 3, 2023.

Taiwanese Office Action for Taiwanese Application No. 109109974 dated Jan. 4, 2024.

Taiwanese Office Action for Taiwanese Application No. 110126786 dated Oct. 16, 2023.

Taiwanese Office Action for Taiwanese Application No. 111104002 dated Mar. 8, 2023.

Tajima et al. (2013) "Room-Temperature Si Etching in NO/F2 Gases and the Investigation of Surface Reaction Mechanisms," The Journal of Physical Chemistry C, 117:5118-5125.

Translation of Decision for Grant of Patent dated Feb. 24, 2021 corresponding to Korean Application No. 10-2020-7013289, 1 page.

Translation of Decision for Grant of Patent dated Jul. 28, 2020 corresponding to Korean Application No. 10-2018-7021879, 1 page.

Translation of Decision of Refusal dated Feb. 3, 2021 corresponding to Taiwanese Patent Application No. 106142110, 4 pages.

Translation of First Office Action dated Sep. 28, 2020 corresponding to Korean Patent Application No. 10-2018-0114808, 3 pages.

Translation of Notification of Examination Opinions corresponding to Taiwanese Patent Application No. 106101332 dated Nov. 19, 2020, 9 pages.

Translation of Notification of Examination Opinions dated May 4, 2020 corresponding to Taiwanese Patent Application No. 106142110, 7 pages.

Translation of Notification of Office Action dated Aug. 27, 2021 corresponding to Korean Patent Application No. 10-2021-7014539, 8 pages.

Translation of Notification of Office Action dated Dec. 17, 2019 corresponding to Korean Patent Application No. 10-2018-7021511, 2 pages.

Translation of Notification of Office Action dated Dec. 19, 2019 corresponding to Korean Patent Application No. 10-2018-7021879, 7 pages.

Translation of Notification of Office Action dated Jun. 26, 2020 corresponding to Korean Patent Application No. 10-2018-7021511, 2 pages.

Translation of Notification of Office Action dated Mar. 29, 2020 corresponding to Korean Patent Application No. 10-2020-7004813, 3 pages.

Translation of Second Office Action dated Feb. 16, 2021 corresponding to Japanese Application No. 2017-039058, 4 pages.

Translation of Written Opinion corresponding to Singapore Application No. 11201907515W dated Mar. 15, 2020, 4 pages.

Translation of Written Opinion corresponding to Singapore Application No. 11201908264Q dated Feb. 19, 2020, 7 pages.

U.S. Office Action dated Oct. 5, 2015 issued in U.S. Appl. No. 14/576,020.

U.S. Appl. No. 62/106,407: filed Jan. 22, 2015, in the names of Joseph Yudovsky et al., & entitled "Injector for Spatially Separated Atomic Layer Deposition Chamber" pp. 1-68. (Year: 2015).

US Final Ofice Action dated Feb. 26, 2016 issued in U.S. Appl. No. 14/576,020.

US Office Action dated Sep. 23, 2016 issued in U.S. Appl. No. 14/576,020.

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).

Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.

Office Action issued in corresponding Korean Patent Application 1020170013979 dated May 29, 2024.

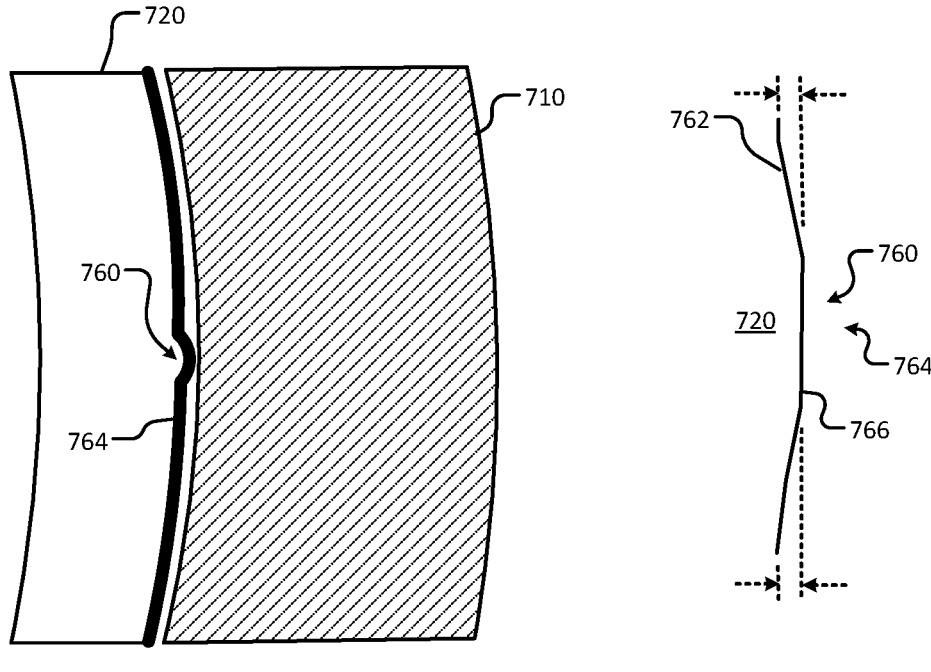
FIG. 9A                    FIG. 9B
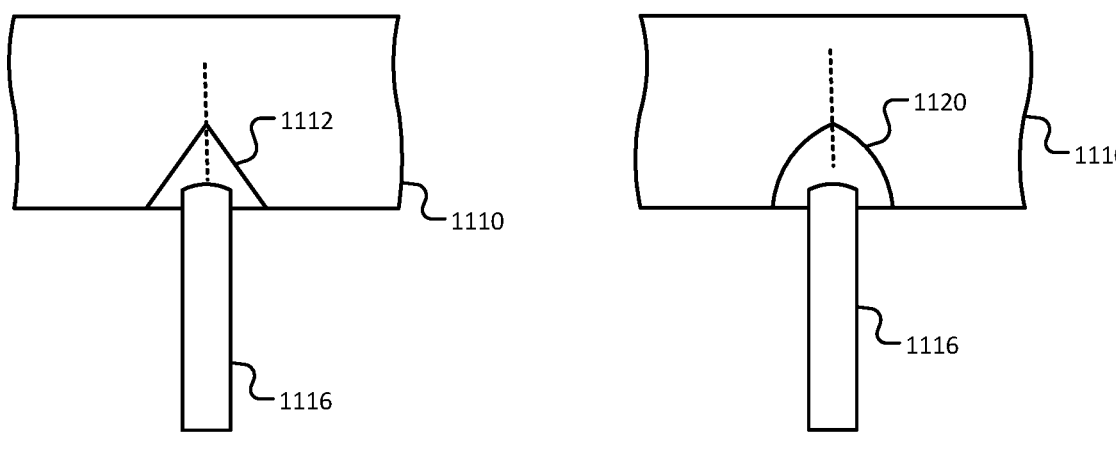
FIG. 10A                    FIG. 10B

MOVEABLE EDGE RINGS FOR PLASMA PROCESSING SYSTEMS

CROSS-REFERENCE TO RELATED APPLICATIONS

This application is a U.S. National Phase Application under 35 U.S.C. 371 of International Application No. PCT/US2021/052732, filed on Sep. 29, 2021, which claims the benefit of U.S. Provisional Application No. 63/087,814, filed on Oct. 5, 2020. The entire disclosures of the applications referenced above are incorporated herein by reference.

FIELD

The present disclosure relates generally to plasma processing systems and more particularly to edge ring systems with a moveable edge ring.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

A substrate is arranged on a substrate support during treatment. An edge ring has an annular body that is arranged around and adjacent to a radially outer edge of the substrate. The edge ring may be used to shape or focus the plasma onto the substrate. During operation, the substrate and an exposed surface of the edge ring is etched by the plasma. As a result, the edge ring wears and the effect of the edge ring on the plasma changes, which may adversely affect uniformity.

SUMMARY

A moveable edge ring system for a substrate processing system includes a top moveable ring including a first annular body arranged around a substrate support. The top moveable ring is exposed to plasma during substrate processing. A moveable support ring is arranged below the top moveable ring and radially outside of a baseplate of the substrate support and includes a second annular body. A shield ring is arranged radially outside of the moveable support ring and includes a third annular body. A cover ring includes a fourth annular body arranged above a radially outer edge of the top moveable ring. An actuator and a lift pin are configured to adjust a position of the top moveable ring and the moveable support ring relative to the shield ring and the cover ring.

In other features, the top moveable ring includes a first annular recess on an upper and radially outer surface of the first annular body. The shield ring includes a projection extending upwardly from an upper and radially outer surface of the third annular body. The cover ring includes a second annular recess configured to receive the projection. A third annular recess is configured to align with the first annular recess of the top moveable ring when the top moveable ring and the moveable support ring are raised.

In other features, the top moveable ring, the moveable support ring, and the shield ring are conductive while the cover ring is nonconductive. As the top moveable ring and the moveable support ring are moved from a lowest position to intermediate positions and to an uppermost position, the moveable support ring maintains greater than or equal to about 70% of vertical side portions of a radially outer surface of the moveable support ring within a predetermined coupling gap of the shield ring and greater than or equal to about 50% of vertical side portions of a radially inner surface of the moveable support ring are located within a predetermined coupling gap of the baseplate. In some embodiments, the predetermined coupling gap is greater than zero and less than or equal to about 20 mils.

In other features, as the top moveable ring and the moveable support ring are moved from a lowest position to intermediate positions and to an uppermost position, the moveable support ring maintains greater than or equal to about 90% of vertical side portions of a radially outer surface of the moveable support ring within a predetermined coupling gap of the shield ring and greater than or equal to about 60% of vertical side portions of a radially inner surface of the moveable support ring are located within a predetermined coupling gap of the baseplate. In some embodiments, the predetermined coupling gap is greater than zero and less than or equal to about 20 mils.

In other features, an edge ring including a fifth annular body having an "L"-shaped cross-section. The substrate support includes a heating layer arranged on a baseplate. The edge ring is arranged between the heating layer of the substrate support and radially inner sides of the top moveable ring and the moveable support ring.

In other features, the top moveable ring, the moveable support ring and the shield ring are conductive, and the cover ring and the edge ring are nonconductive. An edge ring includes a fifth annular body and is arranged radially outside of the shield ring and the cover ring. The top moveable ring, the moveable support ring and the shield ring are conductive, and the cover ring and the edge ring are nonconductive.

In other features, the edge ring includes an annular recess on an upper and radially inner surface thereof to receive the cover ring. A lower surface of the moveable support ring includes a ring centering portion to center the moveable support ring when the lift pin biases the ring centering portion. A lower surface of the top moveable ring includes a ring centering portion to center the top moveable ring when the moveable support ring biases the ring centering portion of the top moveable ring.

In other features, at least one of the top moveable ring, the moveable support ring and the shield ring includes a horizontal ring spacer. The horizontal ring spacer includes at least one of a shim, a projection and a pin.

A system includes the moveable edge ring system and the substrate support configured to support a substrate. A controller is configured to control the actuator to move the lift pin to adjust a height of the moveable support ring and the top moveable ring relative to the substrate support.

In other features, the controller is configured to adjust the height of the moveable support ring and the top moveable ring in response to at least one of a number of RF plasma cycles, a number of substrates processed and a period of a RF exposure.

An edge ring system for a substrate processing system includes a top stationary ring including a first annular body that is directly exposed to plasma during substrate processing. A moveable ring is arranged below the top stationary ring and radially outside of a baseplate of a substrate support and including a second annular body. A shield ring is arranged below and radially outside of the moveable ring and including a third annular body. An actuator and lift pin are configured to adjust a position of the moveable ring relative to the top stationary ring and the shield ring.

In other features, a cover ring is nonconductive and is arranged above a radially outer edge of the top stationary ring. The top stationary ring includes a first annular recess on an upper and radially outer surface of the first annular body.

In other features, the shield ring includes a projection extending upwardly from an upper and radially outer surface of the third annular body. The cover ring includes a second annular recess configured to receive the projection and a third annular recess configured to mate with the first annular recess of the top stationary ring.

In other features, the top stationary ring, the moveable ring and the shield ring are made of conductive material. As the moveable ring is moved from a lowest position to intermediate positions and to an uppermost position, the moveable ring maintains greater than or equal to about 70% of vertical side portions of a radially outer surface of the moveable ring within a predetermined coupling gap of the shield ring and greater than or equal to about 50% of vertical side portions of a radially inner surface of the moveable ring within a predetermined coupling gap of the baseplate. The predetermined coupling gap is less than or equal to about 30 mils.

In other features, the moveable ring has a "T"-shaped cross-section and the shield ring has an inverted "T"-shaped cross-section. A cover ring includes a fourth annular body. A substrate support includes a heating layer arranged on a baseplate, and wherein the cover ring is arranged between the heating layer of the substrate support and a radially inner surface of the top stationary ring when the top stationary ring is in a lowered position.

In other features, the top stationary ring, the moveable ring and the shield ring are conductive, and the cover ring is nonconductive.

In other features, an edge ring includes an annular body and arranged radially outside of the shield ring.

In other features, the edge ring includes an annular recess on an upper and radially inner surface thereof to receive the cover ring. The top stationary ring, the moveable ring and the shield ring are conductive, and the cover ring and the edge ring are nonconductive.

In other features, the top stationary ring includes a radially inner portion, an upwardly sloped portion extending from the radially inner portion, a planar portion extending from the upwardly sloped portion. The moveable ring includes a radially inwardly projecting portion and a radially outwardly projecting portion. An upper and radially inner surface of the radially inwardly projecting portion includes a sloped portion.

In other features, an upper surface of the sloped portion extends parallel to a lower surface of the upwardly sloped portion. A lower surface of the moveable ring includes a ring centering portion to center the moveable ring when the lift pin biases the ring centering portion of the moveable ring. At least one of the top stationary ring, the moveable ring and the shield ring includes a horizontal ring spacer.

In other features, the horizontal ring spacer includes at least one of a shim, a projection and a pin.

A system comprises the edge ring system, the substrate support configured to support a substrate and a controller configured to adjust a height of the actuator to move the lift pin to adjust a height of the moveable ring relative to the top stationary ring.

In other features, the controller is configured to adjust the height of the moveable ring in response to at least one of a number of RF plasma cycles, a number of substrates processed and a period of a RF exposure.

A substrate processing system includes a substrate support including cylindrical body, an annular projecting portion extending from a lower portion of the cylindrical body, and a shield portion extending upwardly from a radially outer edge of the annular projecting portion, wherein a cavity is defined between the cylindrical body and the shield portion. A top moveable ring includes a first annular body arranged around a substrate support. The top moveable ring is exposed to plasma during substrate processing. A moveable support ring includes a second annular body. The moveable support ring is arranged below the top moveable ring in the cavity between the shield portion and the cylindrical body.

In other features, a cover ring is arranged above a radially outer edge of the top moveable ring. An actuator and lift pin are configured to adjust a position of the top moveable ring and the moveable support ring relative to the shield portion and the cover ring. The top moveable ring includes a first annular recess on an upper and radially outer surface of the first annular body.

In other features, the top moveable ring, the cylindrical body, the moveable support ring and the shield portion are conductive, and the cover ring is nonconductive. As the top moveable ring and the moveable support ring are moved from a lowest position to intermediate positions and to an uppermost position, the moveable support ring maintains greater than or equal to about 70% of vertical side portions of a radially inner surface of the moveable support ring within a predetermined coupling gap of the cylindrical body and greater than or equal to about 50% of vertical side portions of a radially outer surface of the moveable support ring are located within a predetermined coupling gap of the shield portion. The predetermined coupling gap is greater than zero and less than or equal to about 20 mils.

In other features, a lower surface of the moveable support ring includes a ring centering portion to center the moveable support ring relative to the cylindrical body when the lift pin biases the ring centering portion of the moveable support ring. At least one of the top moveable ring, the moveable support ring and the shield ring includes a horizontal ring spacer. In some embodiments, the horizontal ring spacer includes at least one of a shim, a projection and a pin.

In other features, the system includes an actuator, a lift pin and a controller configured to cause the actuator to move the lift pin to adjust a height of the moveable support ring and the top moveable ring relative to the substrate support.

In other features, the controller is configured to adjust the height of the moveable support ring and the top moveable ring in response to at least one of a number of RF plasma cycles, a number of substrates processed and a period of a RF exposure.

A moveable edge ring system for a substrate processing system includes a top moveable ring including a first annular body arranged around a substrate support. An upper surface of the top moveable ring is exposed to plasma during substrate processing. A moveable support ring is arranged below the top moveable ring and radially outside of a baseplate of the substrate support and includes a second annular body. A shield ring is arranged below and radially outside of the moveable support ring and includes a third annular body. An actuator and a lift pin configured to adjust a position of the top moveable ring and the moveable support ring relative to the shield ring. The top moveable ring, the moveable support ring and the shield ring are made of conductive material. As the top moveable ring and the moveable support ring are moved from a lowest position to intermediate positions and to an uppermost position, the moveable support ring maintains greater than or equal to about 70% of vertical side portions of a radially outer surface of the moveable support ring within a predetermined coupling gap of the shield ring and greater than or equal to about 50% of vertical side portions of a radially inner surface of the moveable support ring within a predetermined coupling gap of the baseplate. The predetermined coupling gap is greater than zero and less than or equal to about 20 mils.

In other features, the predetermined coupling gap is greater than zero and less than or equal to about 10 mils.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 9A is a side cross-sectional view of a ring with a ring spacer including a plurality of projections according to certain embodiments of the present disclosure;

FIG. 9B is an enlarged side cross-sectional view of a ring with a ring spacer including a projection with a raised flat portion according to certain embodiments of the present disclosure;

FIGS. 10A and 10B are side cross-sectional views of examples of ring centering portions according to certain embodiments of the present disclosure;

In the drawings, reference numbers may be reused to identify similar and/or identical elements.

DETAILED DESCRIPTION

During substrate processing, a substrate is arranged on a pedestal such as an electrostatic chuck (ESC), process gases are supplied, and plasma is struck in the processing chamber. Exposed surfaces of components within the processing chamber experience wear due to exposure to the plasma.

For example, an edge ring is arranged around a radially outer edge of the substrate to shape the plasma. After processing substrates, the exposed surface of the edge ring may be worn down and sits at a different height relative to the substrate. As a result, the effect of the edge ring on the plasma changes, which alters the effect of the process on the substrate. Therefore, in some substrate processing systems, the processing chamber will need to be opened to replace the worn edge ring.

To reduce process changes due to edge ring wear without breaking vacuum, some processing chambers deploy adjustable edge rings. These processing chambers may increase the height of the adjustable edge ring to compensate for wear or to allow tuning for different process conditions in a recipe. This approach increases the time between edge ring replacement, which reduces replacement cost and decreases the overall down time.

As the height of the edge ring changes, capacitive coupling between the plasma, the sheath and/or capacitance delivery structures (including the edge ring) also changes. These changes in capacitive coupling can cause substrate processing non-uniformities over time. Capacitive coupling variation may also occur in response to other factors such as thermal expansion of the edge rings, erosion of gaps between adjacent rings and part-to-part variability.

In some instances, coatings, spacers and/or minimum gaps are used to minimize capacitance variation. However, these mechanisms may reduce the overall coupling capacitance, which lowers the RF voltage on the edge ring. As a result, higher geometric height would be required to achieve the desired vertical tilt.

Various edge ring arrangements according to the present disclosure include a top moveable ring that reduces capacitive coupling variation as the top moveable ring is worn. FIGS. 2A and 2B, 3A and 3B, 5A and 5B and 6A and 6B illustrate tunable top moveable rings. As further described below, a geometric height of the top moveable ring can be varied by changing the height of the top moveable ring using a moveable support ring and lift pins.

Figure 4A:
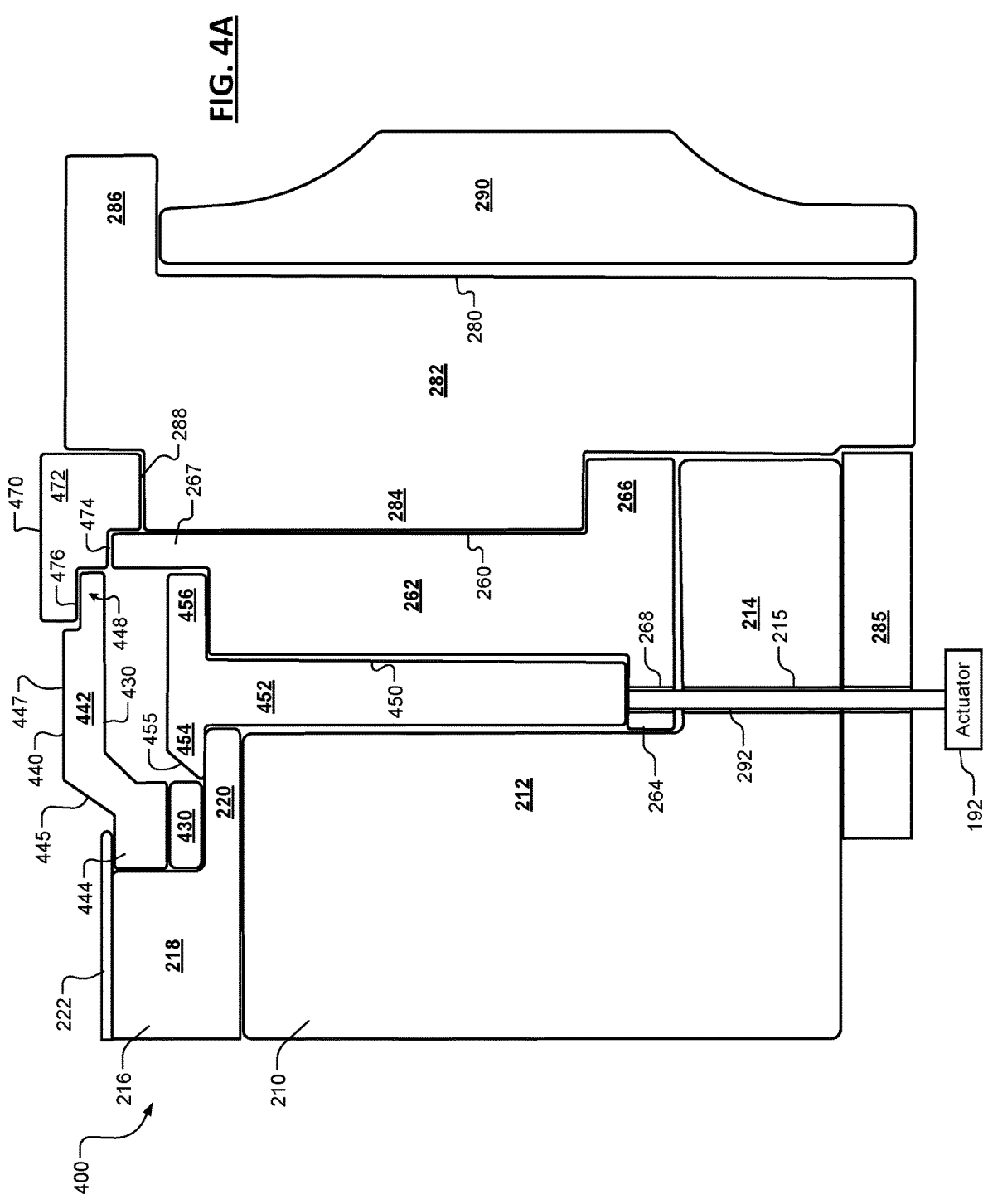
FIGS. 4A and 4B are cross-sectional side views of another example of a moveable ring located below a top stationary ring and arranged in lowered and raised positions, respectively, according to certain embodiments of the present disclosure.
Figure 4B:
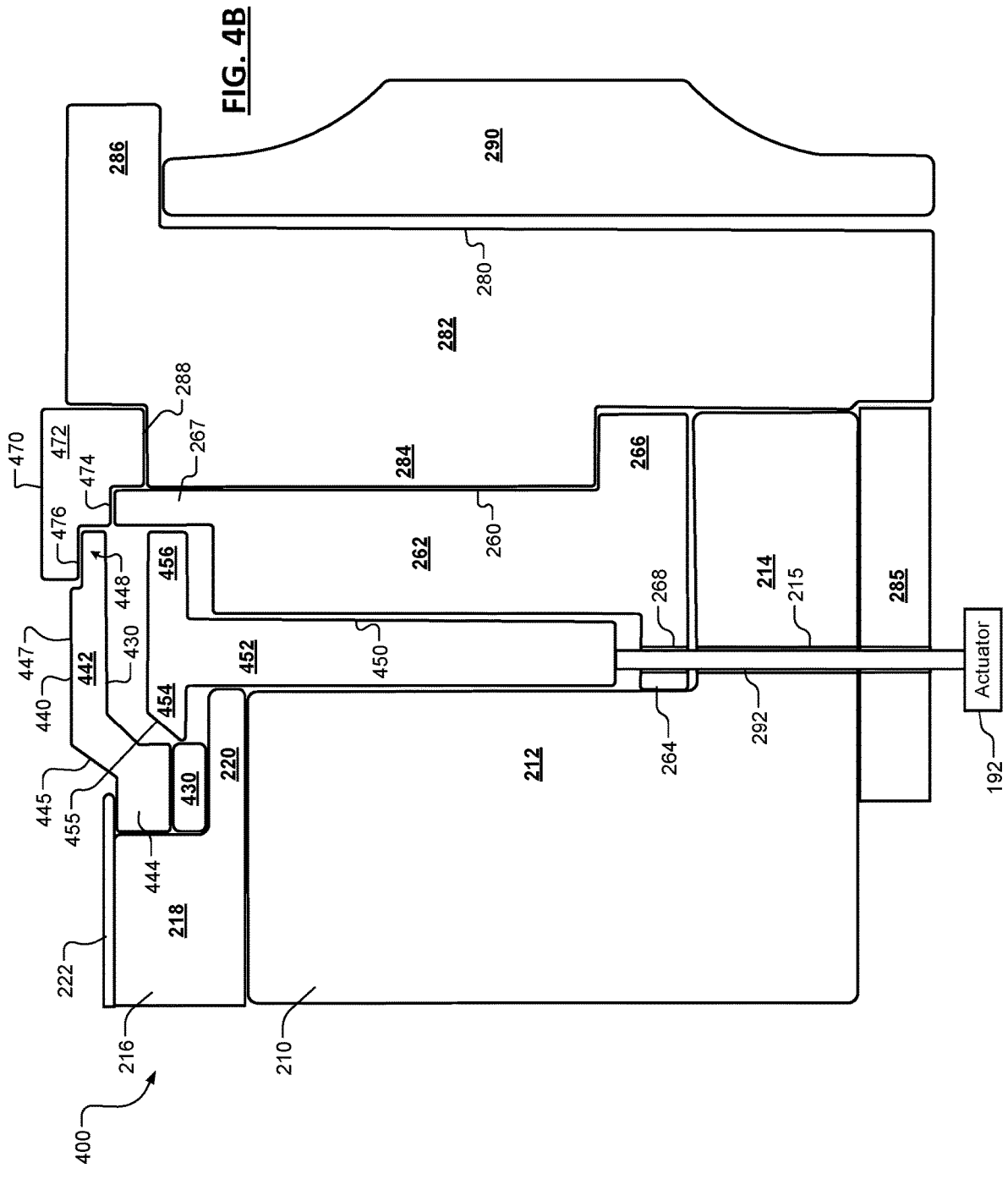

FIGS. 4A and 4B illustrate another type of tunable edge ring according to certain embodiments of the present disclosure. As described further below, a top ring in FIGS. 4A and 4B is stationary and a moveable ring and lift pin arranged below the top ring are adjusted to tune the RF voltage on the top ring and control the plasma sheath.

Figure 1:
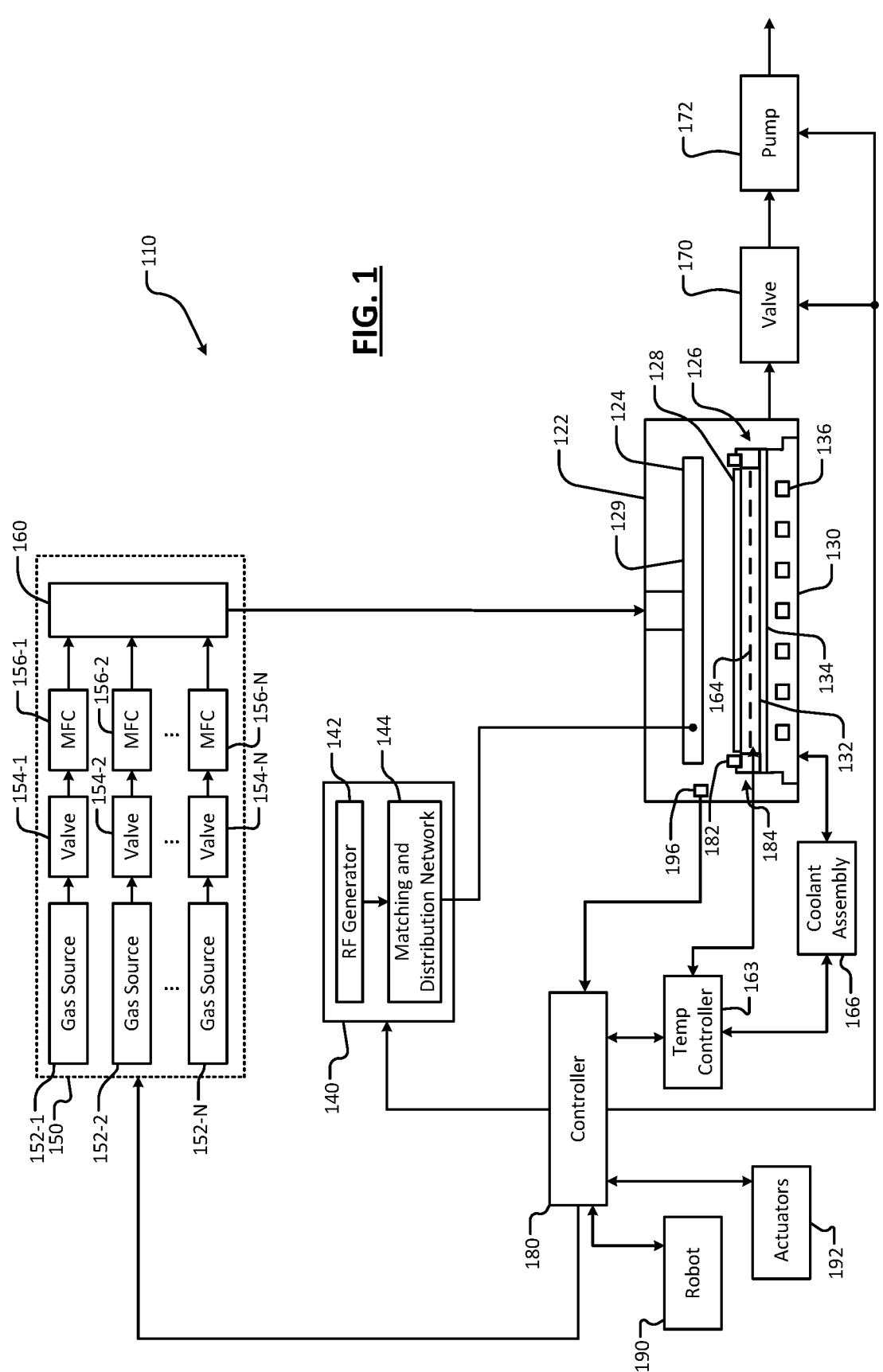
FIG. 1 is a functional block diagram of an example of a plasma processing system for substrates according to the present disclosure.

Referring now to FIG. 1, an example of a substrate processing system 110 that performs plasma processing and that includes a movable edge ring system according to certain embodiments of the present disclosure is shown. While a specific type of plasma processing chamber is shown, other plasma processing chambers can be used. The substrate processing system 110 may be used to perform etching using capacitively coupled plasma (CCP). The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. An annular body is generally cylindrical and extends radially outwardly from an opposite end of the stem portion at a location that is spaced from the top surface of the processing chamber. A substrate-facing surface or faceplate of the annular body of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A bonding and/or a thermal resistance layer 134 may be arranged between the heating plate 132 and the baseplate 130. The baseplate 130 may include one or more channels 136 for flowing coolant through the baseplate 130.

An RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may include one or more controllers that are used to control components of the substrate processing system 110. In some examples, a moveable edge ring 182 is arranged radially outside of the substrate 128 during plasma processing and is exposed to plasma. In other examples, a moveable edge ring is located below a stationary edge ring that is exposed to plasma. An edge ring height adjustment system 184 may be used to adjust a height of a top surface of the moveable edge ring 182 relative to the substrate 128 (or to alter the RF voltage of the stationary edge ring) as will be described further below. In some examples, the moveable edge ring 182 can also be raised, removed by a robot end effector and replaced with another edge ring without breaking vacuum.

In certain embodiments, the system controller 180 controls a robot 190 to deliver substrates and/or edge rings to the processing chamber as will be described further below. The system controller 180 also controls one or more actuators 192 that move lift pins to adjust a height or tilt of the edge rings as further described below. The system controller 180 may also receive outputs from one or more sensors 196 that are used to sense a height of the edge rings. Non-limiting examples of sensors include optical sensors, physical sensors, piezo sensors, ultrasonic sensors, etc.

Figure 2A:
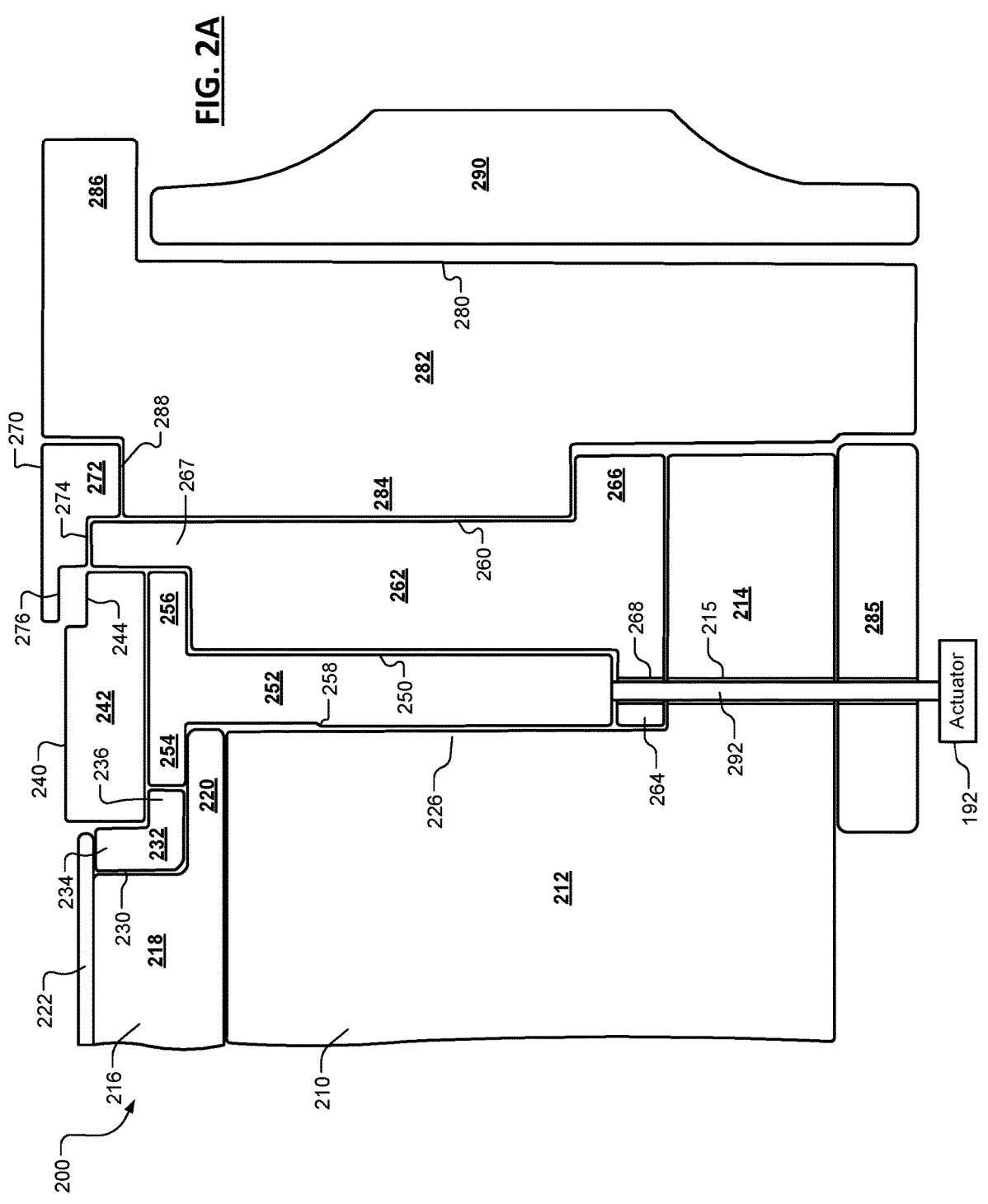
FIGS. 2A and 2B are cross-sectional side views of an example of a top moveable ring in lowered and raised positions, respectively, according to certain embodiments of the present disclosure.
Figure 2B:
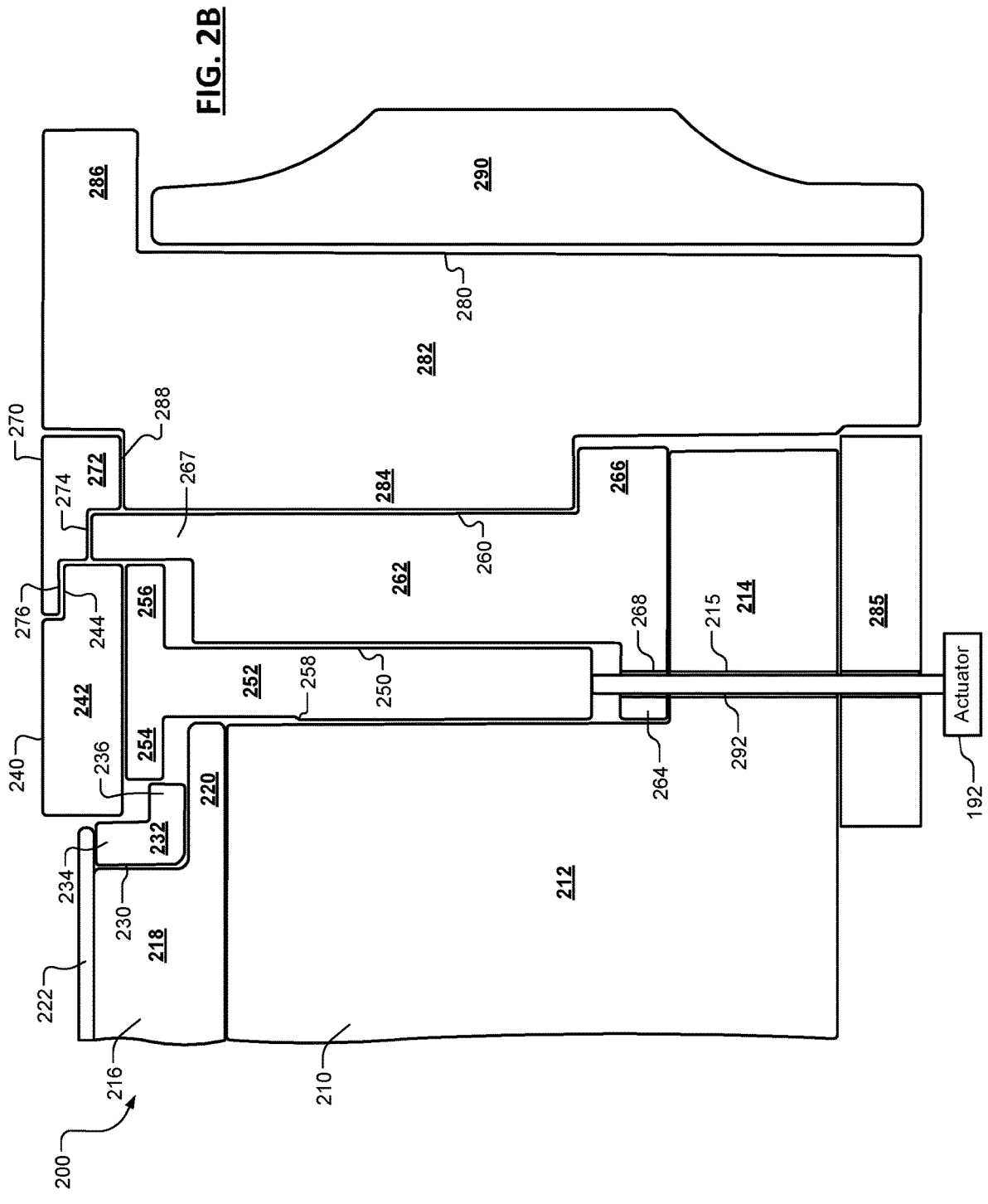

Referring now to FIGS. 2A and 2B, an edge ring system 200 according to certain embodiments of the present disclosure is shown with moveable edge rings in a lowered position (FIG. 2A) and a raised position (FIG. 2B). The edge ring system 200 is configured to adjust a geometric height of an upper surface of a top moveable ring 240 relative to an upper surface of a substrate 222. The substrate support includes a baseplate 210 including a cylindrical body 212 and an annular projecting portion 214 extending radially outwardly from a lower portion of the cylindrical body 212. The annular projecting portion 214 of the baseplate 210 includes a cavity 215 extending in a vertical direction to allow a lift pin 292 to move reciprocally therein.

A heating layer 216 is arranged above the baseplate 210. The heating layer 216 includes a cylindrical body 218 and an annular projecting portion 220 extending outwardly from a lower portion of the cylindrical body 218. A bonding layer (not shown) may be arranged between the heating layer 216 and the baseplate 210

As shown in FIG. 2A, the edge ring system 200 includes a ring 230, a shield ring 260, a cover ring 270, a ring 280 and a ring 290 that are stationary, the top moveable ring 240 and a moveable support ring 250. In this context, the term stationary means that the edge rings are not generally moved after installation without breaking vacuum and the term moveable means that a position of the rings can be adjusted after installation without breaking vacuum by an actuator described further below.

The ring 230 is arranged below a radially outer edge of a substrate 222, above the annular projecting portion 220 of the heating layer 216, and between the heating layer 216 and radially inner edges of the top moveable ring 240 and the moveable support ring 250. The ring 230, according to certain embodiments, has an "L"-shaped cross section and includes an annular body 232, a vertical portion 234 and a horizontal portion 236.

The top moveable ring 240 includes an upper surface that is exposed directly to plasma. In some embodiments, the top moveable ring 240 is arranged radially outward from the substrate 222, partially below the top cover ring 270, above and adjacent to the rings 230 and 260, and directly above and in contact with moveable support ring 250. According to some embodiments, the top moveable ring 240 includes an annular body 242 having a generally rectangular cross-section and an annular recess 244 located on a radially outer and upper portion of the annular body 242.

The moveable support ring 250 includes an annular body 252 that is located below the top moveable ring 240 and between a radially inner surface of the shield ring 260 and a radially outer side surface of the baseplate 210. In some embodiments, the moveable support ring 250 has a "T"-shaped cross-section, although other cross-sections may be used. An upper portion of the moveable support ring 250 includes a radially inwardly projecting portion 254 and a radially outwardly projecting portion 256. Upper surfaces of the radially inwardly projecting portion 254 and the radially outwardly projecting portion 256 are arranged directly adjacent to and in contact with a lower surface of the top moveable ring 240.

In some embodiments, the moveable support ring 250 further includes a projecting portion 258 located along a radially inner and lower side portion of the annular body 252 to enhance coupling with the baseplate 210. In certain embodiments, the projecting portion 258 extends vertically to a location of the moveable support ring 250 that lies adjacent to the radially outer surface of the baseplate within the coupling gap for all vertical positions of the moveable support ring 250 to maintain uniform capacitive coupling.

The upper surface of the top moveable ring 240 may erode due to plasma exposure. In some embodiments, the top moveable ring 240 and the moveable support ring 250 are raised to compensate for the erosion of the upper surface such that the upper surface of the top moveable ring 240 remains in a substantially stationary position relative to substrate 222.

The shield ring 260 is located between the moveable support ring 250 and the ring 280 and above the annular projecting portion 214 of the baseplate 210. In some examples, the shield ring 260 is made of a conductive material and is arranged radially outside of the moveable support ring 250. The location of the shield ring 260 helps to control voltage of the moveable support ring 250 and to block coupling to the ring 290 (to help maintain high voltage). In some examples, the shield ring 260 may be integrated with the baseplate 210 as will be described further below.

According to some embodiments, the shield ring 260 has an inverted T"-shaped cross-section, an annular body 262, a radially inwardly projecting portion 264 and a radially outwardly projecting portion 266. Lower surfaces of the radially inwardly projecting portion 264 and the radially outwardly projecting portion 266 are arranged directly adjacent to an upper portion of the annular projecting portion 214 of the baseplate 210. The shield ring 260 further includes an upwardly projecting portion 267 extending vertically from a radially outer edge of an upper surface of the annular body 262. A cavity 268 is aligned with the cavity 215 to allow an actuator 192 to move the lift pin 292 reciprocally therein.

As shown in FIGS. 2A-2B, the top cover ring 270 is located above the top moveable ring 240, the shield ring 260 and the ring 280 and has an upper surface that is directly exposed to plasma. In some examples, the top cover ring 270 includes an annular body 272, a first stepped portion 274 and a second stepped portion 276. The first stepped portion 274 is arranged above the upwardly projecting portion 267 of the shield ring 260. The second stepped portion 276 is received by the annular recess 244 of the top moveable ring 240. The second stepped portion 276 covers radially outer edges of the top moveable ring 240 and the moveable support ring 250. In other examples, the top cover ring 270 may include additional steps, fewer steps or no steps. In some examples, the top cover ring 270 has a rectangular cross-section.

The ring 280 is located radially outside of the shield ring 260, the annular projecting portion 214 of the baseplate 210, and a supporting plate 285. The ring 280 includes an annular body 282 and a projection 284 extending radially inwardly from a portion of a radially inner surface of the annular body 282. The annular body 282 includes an annular recess 288 that is arranged on an upper and radially inner edge of the annular body 282. The annular body 282 includes a projecting portion 286 extending radially outwardly from an upper edge of the annular body 282. The ring 290 is located radially outside of the ring 280 below the projecting portion 286. In some embodiments, top cover ring 270 may be made of quartz and ring 280 may be made of quartz or ceramic.

As can be seen in FIGS. 2A and 2B, an actuator 192 biases the lift pin 292 to adjust a height of the lift pin 292. The lift pin 292 biases the moveable support ring 250 to lift the top moveable ring 240 relative to an upper surface of the substrate 222. Adjusting the geometric height of the top moveable ring 240 compensates for wear due to exposure to plasma. In some examples, the top moveable ring 240, the moveable support ring 250, the shield ring 260 and the ring 290 are made of conductive material. The ring 230, the cover ring 270 and the ring 280 are made of non-conductive material.

The arrangement shown in FIGS. 2A and 2B maintains relatively uniform capacitive coupling with the baseplate 210 and/or the shield ring 260 as the top moveable ring 240 and the moveable support ring 250 move from the lowest position to the various raised positions. In some examples, greater than or equal to 70%, 80%, or 90% of vertically-oriented side portions of a radially outer side surface of moveable support ring 250 are located within a predetermined coupling gap of the shield ring 260 in the various height positions of the top moveable ring 240 and the moveable support ring 250. In the example in FIGS. 2A and 2B, 100% of the vertically-oriented side portions of the radially outer side surface of moveable support ring 250 are located within the predetermined coupling gap of the shield ring 260 in the various height positions of the top moveable ring 240 and the moveable supporting ring 250.

In some examples, the predetermined coupling gap is greater than zero and less than or equal to 30 mils, 20 mils or 10 mils. As used herein, 1 mil=1/1000 inch. The predetermined coupling gap is sufficiently large to allow relative movement of the moveable rings with sufficient room for expansion of the ring and/or adjacent surfaces due to heating during plasma processing. The predetermined coupling gap should also be small enough to provide sufficient capacitive coupling to adjacent rings or the baseplate to maintain the RF voltage on the top edge ring as the position of the ring is raised due to wear on the top edge ring.

In some examples, greater than or equal to 50%, 60%, or 70% of vertically-oriented portions of a radially inner side surface of moveable support ring 250 are located within a predetermined coupling gap of the baseplate 210 in the various height positions of the top moveable ring 240 and the moveable support ring 250. In some examples, capacitive coupling of vertical side portions of the baseplate 210, the moveable support ring 250 and the shield ring 260 remain constant for all vertical positions of moveable support ring 250.

Figure 3A:
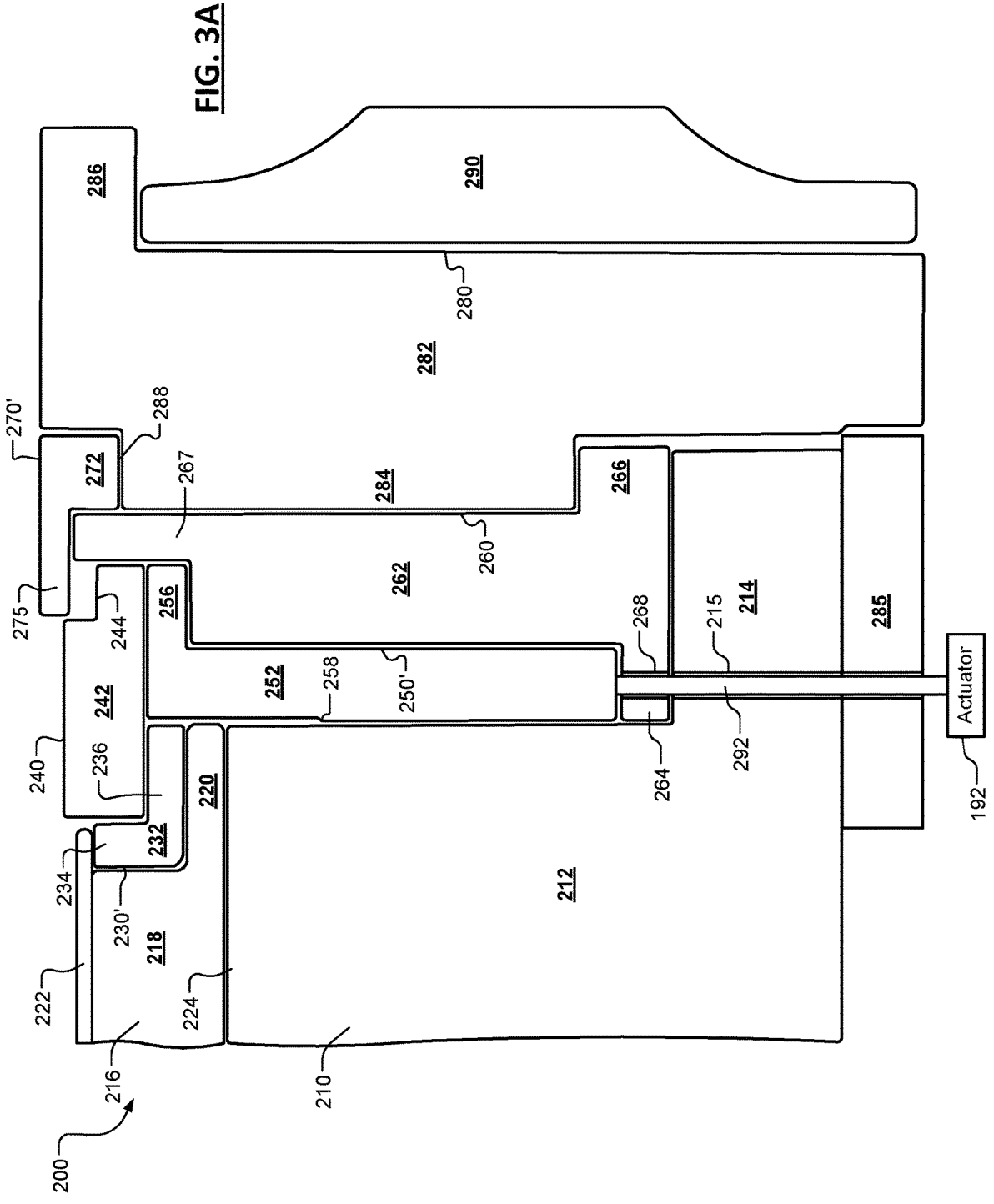
FIGS. 3A and 3B are cross-sectional side views of another example of a top moveable ring in lowered and raised positions, respectively, according to certain embodiments of the present disclosure.
Figure 3B:
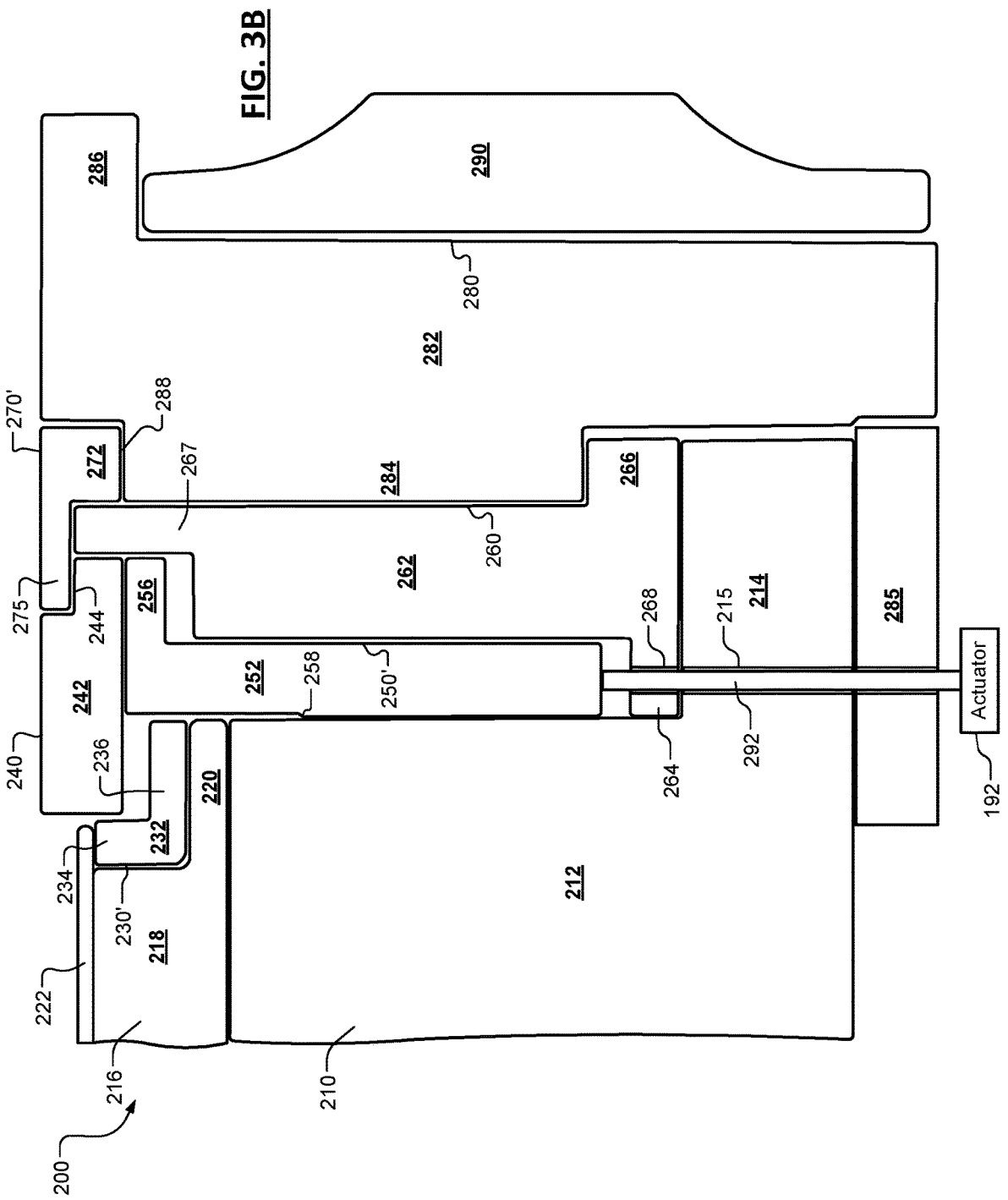

Referring now to FIGS. 3A and 3B, the ring 230, the moveable support ring 250 and the cover ring 270 can have other cross-sectional shapes. In FIG. 3A, a moveable support ring 250' includes the annular body 252. In some examples, the moveable support ring 250' has an "L"-shaped cross-section. The horizontal portion 236 of the ring 230' extends to a radially inner surface of the moveable support ring 250'. A top cover ring 270' includes a stepped portion 275 extending radially inwardly from the annular body 272 and defining an annular recess to receive the projecting portion 267 of the shield ring 260 and a radially outer surface of the top moveable ring 240. In FIG. 3B, the lift pin 292 biases the moveable support ring 250 to adjust a height of the top moveable ring 240.

Referring now to FIGS. 4A and 4B, an edge ring system 400 according some embodiments of the present disclosure is shown. The RF voltage on a top stationary ring 440 that is directly exposed to plasma is varied by adjusting a height of the moveable ring 450 located below the top stationary ring 440.

In FIG. 4A, the edge ring system 400, according to some embodiments, further includes the ring 430, the shield ring 260, a cover ring 470, the ring 280 and the ring 290 that are stationary. The ring 430 has an annular body and is arranged below a radially outer edge of the substrate 222, directly below a radially inner edge of the top stationary ring 440, directly above the annular projecting portion 220 of the heating layer 216, and between the heating layer 216 and a radially inner edge of the moveable ring 450. In some examples, the ring 430 has a rectangular cross section.

The top stationary ring 440 includes an upper surface that is exposed directly to the plasma. The top stationary ring 440 is arranged partially below a radially outer edge of the substrate 222 and extends radially outwardly past a radially outer edge of the substrate and rises above the substrate 222. The top stationary ring 440 is located partially below the cover ring 470 and above the moveable ring 450 and the shield ring 260. The top stationary ring 440 includes an annular body 442 having a radially inner portion 444, an upwardly sloped portion 445, a planar portion 447 and an annular recessed portion 448 located on an upper and radially outer surface thereof. An upper surface of the top stationary ring 440 is directly exposed to plasma. The slope of the sloped portion 445 allows for even/uniform erosion across the surface to help maintain a stationary thickness across the ring (as compared to right angle designs).

The moveable ring 450 is located below the top stationary ring 440 and between a radially inner surface of the shield ring 260 and a radially outer side surface of the baseplate 210. The moveable ring 450 has an annular body 452. In some examples, the moveable ring 450 has a "T"-shaped cross-section, a radially inwardly projecting portion 454 and a radially outwardly projecting portion 456. In some examples, a radially inner and upper surface 455 of the radially inwardly projecting portion 454 may be sloped in a manner generally parallel to the sloped portion 445 of the top stationary ring 440.

The cover ring 470 is located above the top stationary ring 440, the shield ring 260 and the ring 280 and has an upper surface that is directly exposed to plasma. The cover ring 470 includes an annular body 472, a first stepped portion 474 and a second stepped portion 476. The first stepped portion 474 is arranged above the upwardly projecting portion 467 of the shield ring 260. The second stepped portion 476 is received by the annular recessed portion 448 of the top stationary ring 440.

As can be seen in FIGS. 4A and 4B, the actuator 192 biases the lift pin 292 to adjust a height of the lift pin 292 and the moveable ring 450 to vary capacitive coupling which varies the RF voltage on the top stationary ring 440. Varying the RF voltage compensates for wear of the top stationary ring 440 due to plasma exposure without changing the geometric height of the top stationary ring 440, which reduces non-uniformity. In some examples, the top stationary ring 440, the shield ring 260, the ring 290 and the moveable ring 450 are made of a conductive material. The ring 430, the cover ring 470 and the ring 280 are made of a non-conductive material.

Figure 5A:
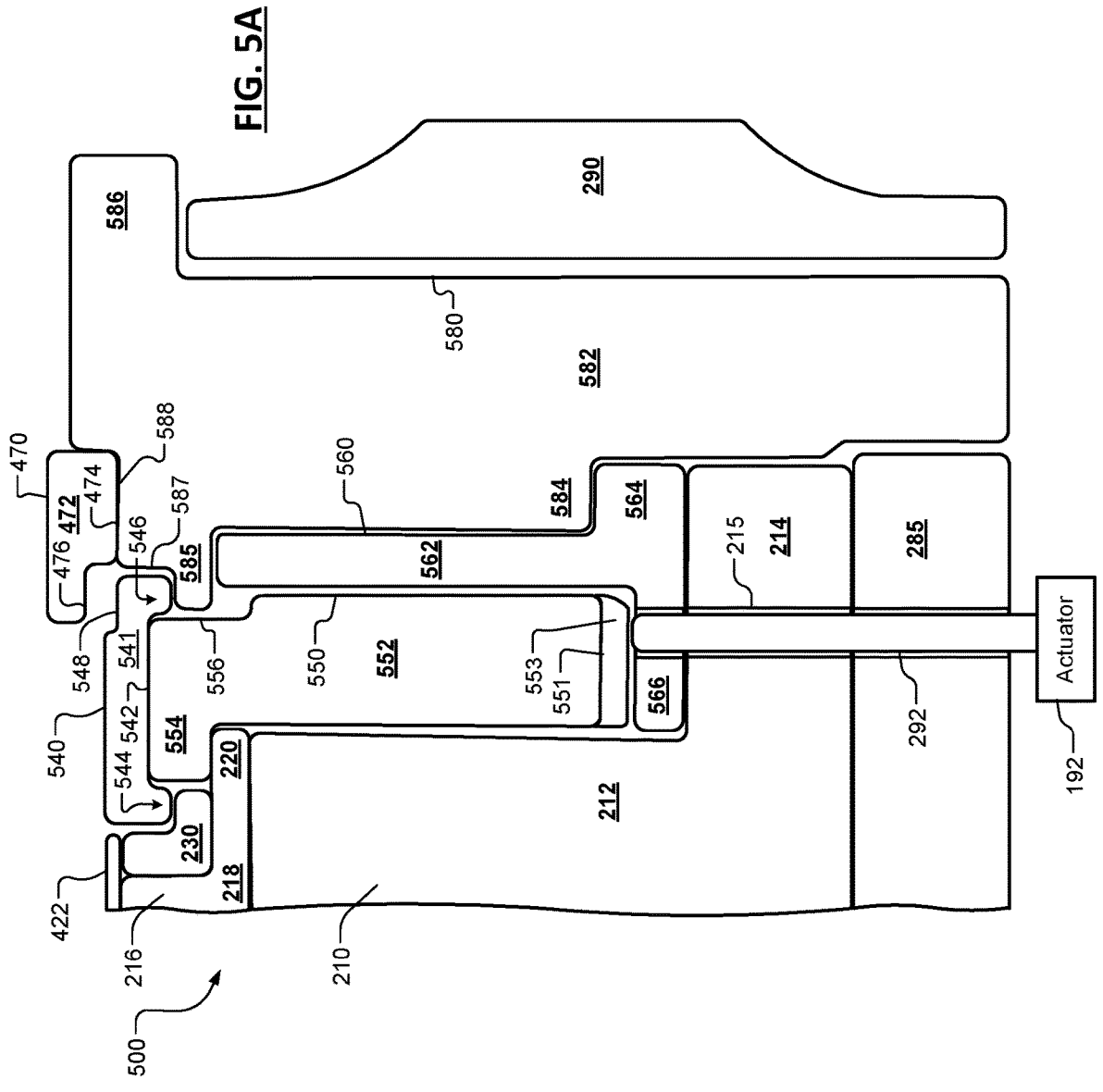
FIGS. 5A and 5B are cross-sectional side views of another example of a top moveable ring in lowered and raised positions, respectively, according to certain embodiments of the present disclosure.
Figure 5B:
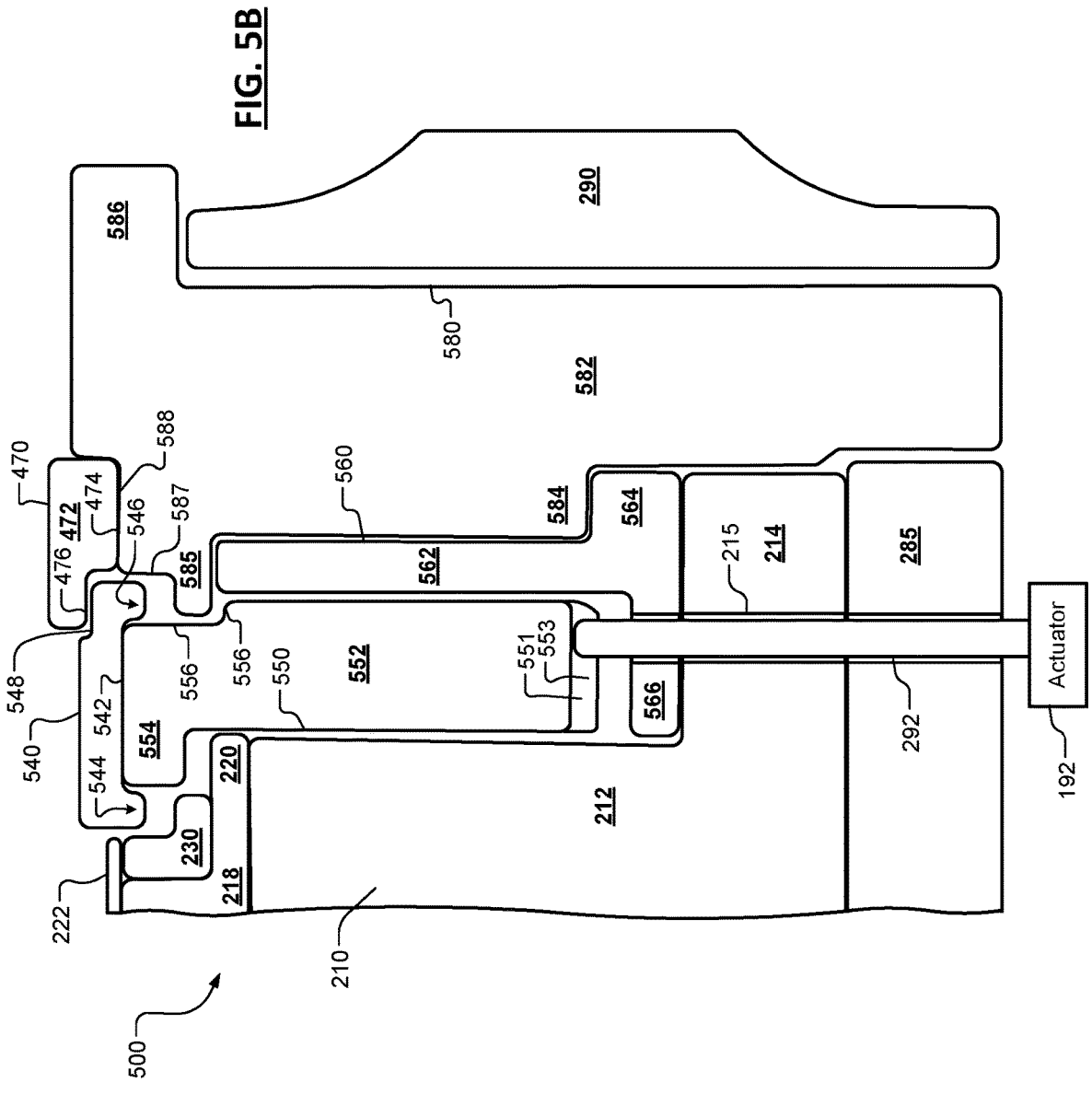

Referring now to FIGS. 5A and 5B, another example of an edge ring system 500 is shown to include a top moveable ring 540, a moveable support ring 550 and a shield ring 560. The top moveable ring 540 is directly exposed to plasma during processing. The top moveable ring 540 rests on the moveable support ring 550. The actuator 192 biases the lift pin 292 into a lower surface of the moveable support ring 550 to adjust a position of the top moveable ring 540 relative to the substrate 422.

The top moveable ring 540 includes an annular body 541. In some examples, the top moveable ring 540 includes a ring centering portion 542 to center the top moveable ring 540 on the moveable support ring 550. In some examples, the ring centering portion 542 may include a cavity formed on a lower surface thereof. In some examples, the cavity has a width sufficient to receive an upper portion of the moveable support ring 250. As can be appreciated, the edge ring systems described herein may include the ring centering portion 542. Downwardly directed projections 544 and 546 of the top moveable ring 540 are arranged at radially inner and outer locations of the annular body 541 on opposite sides of the cavity. An annular recess 548 may be arranged on an upper and radially outer portion of the annular body 541.

In some examples, a lower portion of the top moveable ring 540 includes a ring centering portion 551 to center the moveable support ring 550 relative to the baseplate 210. As can be appreciated, all of the edge ring systems described herein may include the ring centering portion 551. In some examples, the ring centering portion 551 includes a cavity 553 having an inner surface that includes a portion that is sloped linearly or non-linearly (e.g. curved) to bias the moveable support ring 550 into position as it is seated on the lift pin 292. In some examples, the surface of the cavity includes opposing surfaces that provide a centering effect. In some examples, the surface of the cavity has a "V"-shape, a cone shape, a combination of straight and curved shapes or other types of surfaces that provide a centering effect.

The shield ring 560 includes an annular body 562 that partially surrounds the moveable support ring 550. A lower portion of the annular body 562 includes a radially outwardly projecting leg 564 and a radially inwardly projecting leg 566.

A ring 580 is arranged radially outside of the top moveable ring 540, the moveable support ring 550 and the shield ring 560. The ring 580 includes an annular body 582, a first projection 584 extending radially inwardly from a middle portion of a radially inner surface of the ring 580. A projection 585 extends radially inwardly from an upper portion of a radially inner surface of the ring 580. The projection 585 is located below the downwardly projecting leg 546. An annular recess 587 is arranged on the radially inner surface above the projection 585. A projection 586 projects radially outwardly from the upper surface of the ring. An annular recess 588 is arranged on an upper surface of the ring 580. In some examples, the cover ring 470 rests on the annular recess 588. A ring 590 is arranged radially outside of the ring 580 and may be made of a conductive material.

In FIG. 5B, the top moveable ring 540 and the moveable support ring 550 are shown in a raised position. The actuator 192 biases the lift pin 292 into the ring centering portion 551 on the lower surface of the moveable support ring 550 to lift and center the moveable support ring 550, which lifts the top moveable ring 540.

Figure 6A:
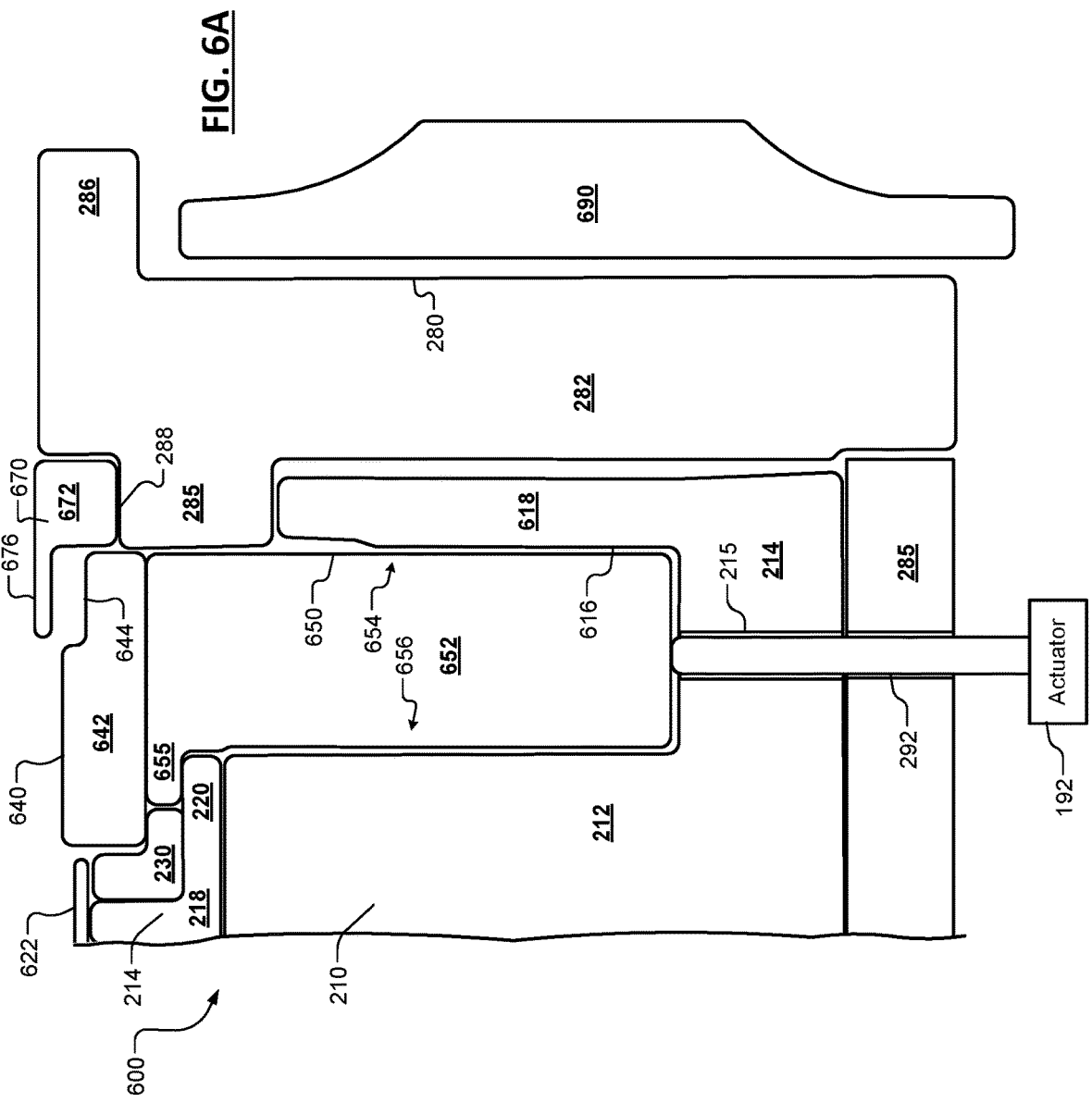
FIGS. 6A and 6B are cross-sectional side views of another example of a top moveable ring in lowered and raised positions, respectively, according to certain embodiments of the present disclosure.
Figure 6B:
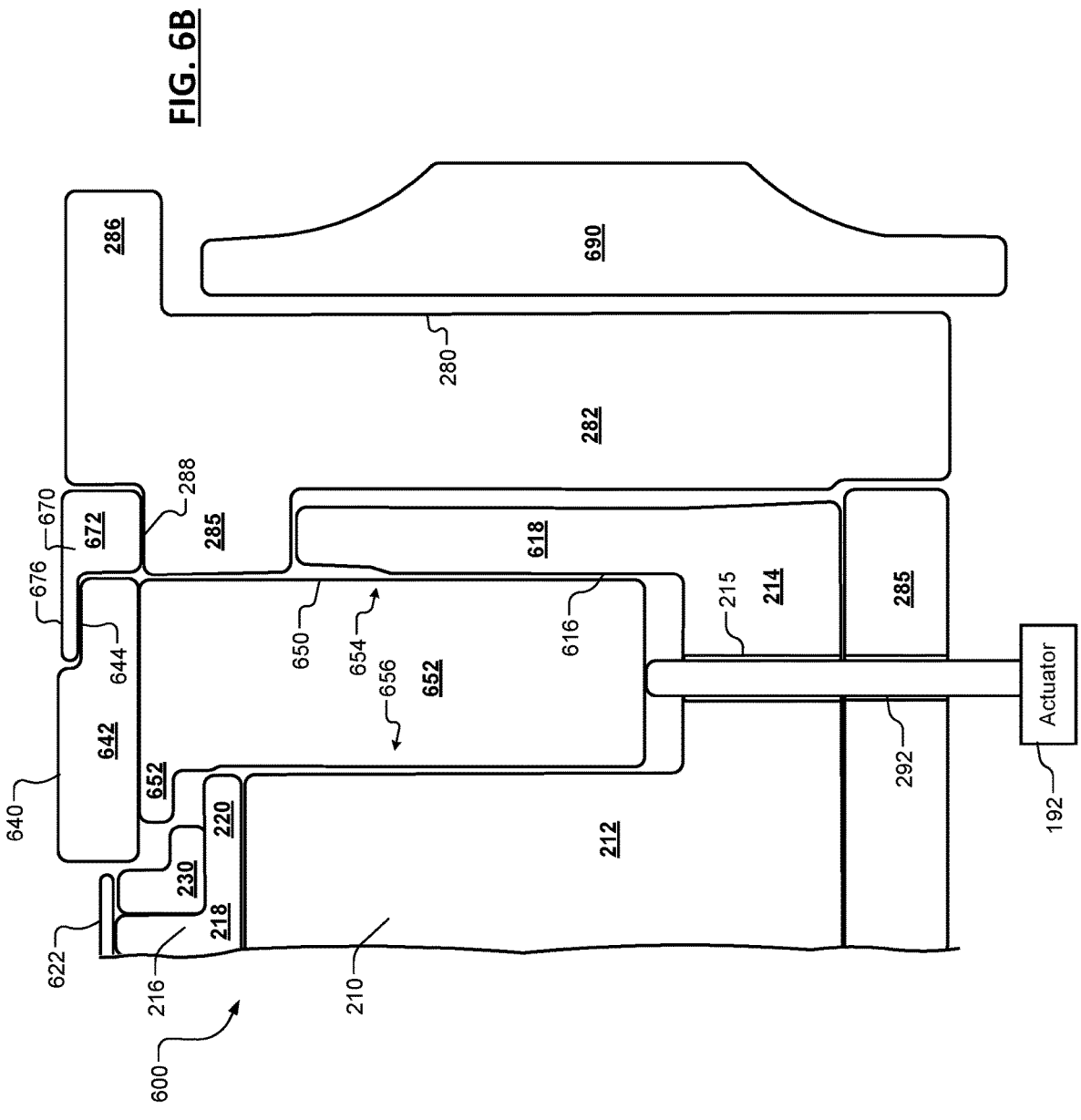

Referring now to FIGS. 6A and 6B, another example of an edge ring system 600 is shown and includes a shield ring that is integrated with the baseplate 210. A top moveable ring 640 includes an upper surface that is directly exposed to plasma. The top moveable ring 640 includes an annular body 642. An upper and radially outer surface of the top moveable ring 640 includes an annular recess 644. In some examples, the annular body 642 has a rectangular cross-section.

A moveable support ring 650 is arranged below the top moveable ring 640. The moveable support ring 650 includes an annular body 652, a radially outer surface 654, and a radially inner surface 656. In some examples, the moveable support ring 650 has an "L"-shaped cross-section and includes a projecting portion 655 extending radially inwardly from an upper portion of the radially inner surface 656.

A cover ring 670 is stationary and includes an annular body 672 and a projection 676 extending radially inwardly from an upper surface of the annular body 672. When the top moveable ring 640 is raised (as shown in FIG. 6B), the projection 676 of the cover ring 670 extends into the annular recess 644. According to some embodiments, the baseplate 210, the top moveable ring 640, the moveable support ring 650 and the ring 690 are conductive and the cover ring 670 and the ring 680 are non-conductive.

In the preceding embodiments, some of the edge rings are made of a conductive material or a conductive or non-conductive material with a conductive coating. As used herein, conductive refers to materials or coatings with a resistivity of less than or equal to $10^4$ $\Omega$cm. For example, doped silicon has a resistivity of 0.05 $\Omega$cm, silicon carbide has a resistivity of 1-300 $\Omega$cm and metals such as aluminum and copper have a resistivity of $\approx 10^{-8}$ $\Omega$cm. In some examples, the edge rings of the present disclosure are made of non-conductive material or a conductive or non-conductive material with a non-conductive coating. As used herein, nonconductive refers to materials/coatings with a resistivity of greater than $10^4$ $\Omega$cm.

The conductive rings can be made of one or more base materials, one or more plating layers, and/or one or more coatings. Non-limiting examples of base materials include silicon, silicon carbide, titanium, graphite, quartz, and/or ceramic. Non-limiting examples of plating layers include aluminum plating. Non-limiting examples of coatings include perfluoroalkoxy (PFA), atomic layer deposition (ALD) aluminum oxide ($Al_2O_3$), ALD yttrium oxide or yttria ($Y_2O_3$), and/or anodized coatings. For example, the conductive materials may include anodized titanium, silicon with a PFA coating, doped silicon, silicon with aluminum plating and an anodized coating, silicon with ALD aluminum oxide, silicon with an ALD yttria coating, silicon carbide, graphite with a PFA coating, graphite with aluminum plating and an anodized coating, graphite with an ALD aluminum oxide coating, graphite with an ALD yttria coating, or other suitable materials. Non-limiting examples of non-conductive materials include quartz and ceramic. In the preceding embodiments, one or more of the rings may be formed by one or more structures in radial, axial or other directions.

Figure 7:
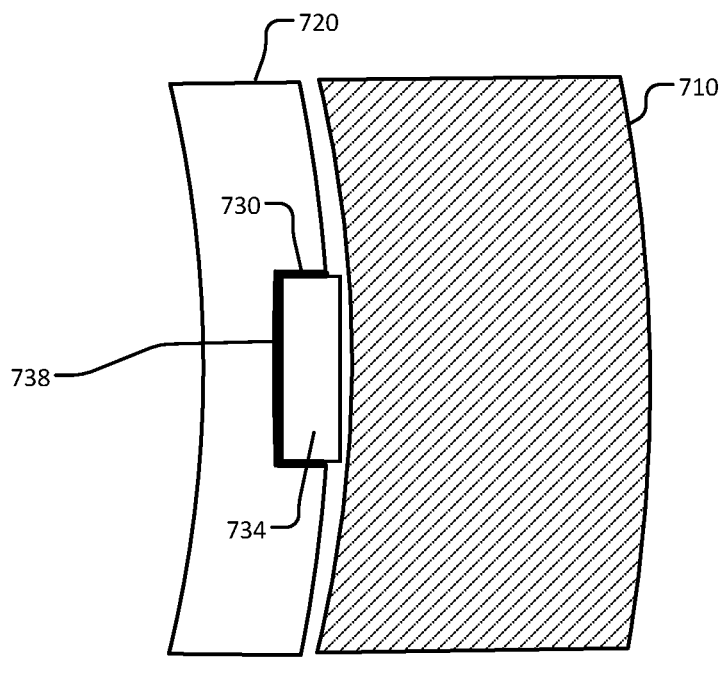
FIG. 7 is a side cross-sectional view of an edge ring system including a ring with a ring spacer including a plurality of shims according to certain embodiments of the present disclosure.

Referring now to FIGS. 7-9B, various ways of limiting movement, controlling spacing and/or horizontal centering one ring relative to another structure such as a ring or the baseplate of the edge ring systems described herein are shown. In FIG. 7, a structure 710 such as a ring, baseplate or other structure in the processing chamber is located adjacent to a surface of a ring 720. FIGS. 7-9B show various ways for limiting movement of the structure 710 relative to the ring 720 are shown.

In FIG. 7, the ring 720 includes a slot 738 located on a radially outer surface thereof. The slot 738 extends radially inwardly into the radially outer surface of the ring 720. A shim 734 is arranged in the slot 738. In some examples, adhesive 730 is used to retain the shim 734 in the slot 738. In some examples, the shim 734 has rectangular plan, radial and side cross-sections, although other shapes can be used. In some examples, the shim 734 has a thickness in a radial direction that is greater than or equal to a depth of the slot 738. In some examples, the shim 734 extends radially outwardly from the ring 720 to a distance sufficient to limit movement (given the number of shims that are used).

Figure 8:
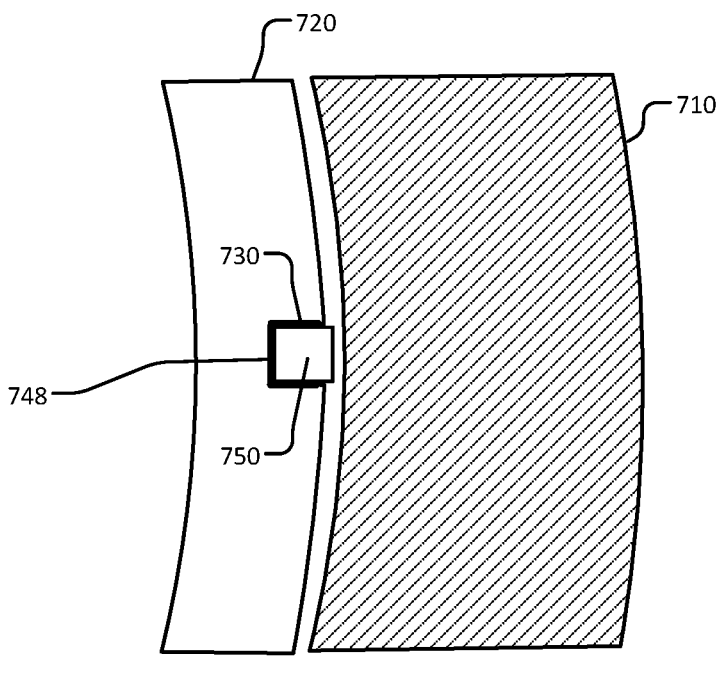
FIG. 8 is a side cross-sectional view of a ring with a ring spacer including a plurality of pins according to certain embodiments of the present disclosure.

In FIG. 8, the ring 720 includes a slot 748 located on a radially outer surface thereof. The slot 748 extends radially inwardly. A pin 750 is arranged in the slot 748. In some examples, adhesive 730 is used to retain the pin 750 in the slot 748. In some examples, the pin 750 has cylindrical shape, although other shapes can be used. In some examples, the pin 750 has a height in a radial direction that is greater than or equal to a depth of the slot 748. In some examples, the pin 750 extends radially from the ring 720 to a distance sufficient to limit movement (given the number of pins that are used). In some examples, the pin 750 extends radially outwardly from the ring 720 to a distance sufficient to limit movement (given the number of shims that are used).

In FIGS. 9A and 9B, the ring 720 includes a projection 760 formed on a radially outer surface thereof. In some examples, the projection 760 extends in a vertical direction partially or fully along the vertical thickness of the radial outer surface. In FIG. 9B, the projection 760 includes a flat surface 766 extending from a radially outer surface 762 of the ring 720, which is easier to machine and to inspect dimensions as compared to arcuate profiles. In some examples, the edge ring is initially formed slightly wider without the projections 760 and then a radially outer surface is machined or removed in areas between adjacent projections to form the projections 760. In other examples, the projections 760 include arcuate or convex profiles in plan view to reduce surface area in contact with the radially inner facing surface of the top edge ring and reduce friction when performing height adjustment or replacing the top edge ring without breaking vacuum.

In some examples, the projections 760 are coated with a coating material 764. In some examples, the coating material 764 is relatively conformal and is made of an insulating material. In some examples, the coating is selected from a group consisting of polytetrafluoroethylene (PTFE), perfluoroalkoxy polymer (PFA), or aluminum oxide, yttrium oxide, or yttrium fluoride deposited using atomic layer deposition. The coating material 764 has an insulating function that prevents short circuits and reduces erosion. The coating material 764 also ensures a minimum gap between the ring 720 and the structure 710 to prevent short circuits.

In some examples, the projection 760 extends radially outwardly from a radially outer surface of the ring 720 to a distance sufficient to limit movement (given the number of projections that are used).

In some examples, the ring 720 includes 3 to 8 spacers (shims or projections) arranged with uniform spacing (e.g. 120° spacing for 3, 72° spacing for 5, 45° spacing for 8 (or 360°/N)) around an outer periphery of the ring 720. As can be appreciated, the spacers are not generally configured to completely constrain relative movement of upper and lower rings. The gap helps reduce binding during height adjustment and/or replacement. Therefore, some relative movement is still desirable and undesirable movement (which may alter the effective coupling capacitance) may still occur with 3 shims. In some examples, the ring 720 includes 5 spacers arranged around an outer periphery of the ring 720 to further constrain movement. Depending upon the particular configuration, additional spacers such as 6, 7 or 8 provide diminishing returns with respect to controlling the effective capacitance and increase cost.

While the spacers (e.g. shims, projections or projections) are shown arranged on an outer surface of the ring 720, the spacers can be arranged on an inner surface of the ring 720 and/or one or both of the inner surfaces of the structure 710. In addition, the spacers and/or insulating coating can be arranged on any of the preceding examples (e.g. in FIGS. 1 to 6B) on one or both of the radially facing surfaces of an edge ring and an adjacent structure.

In some examples, the spacers extend in a radially outward direction in a range from 50 μm to 250 μm from a radially outer surface of the edge ring.

Referring now to FIGS. 10A and 10B, additional examples of horizontal ring spacing features are shown. In FIG. 10A, a ring portion 1110 includes a ring spacing feature 1112 located on a lower surface thereof. The ring spacing feature 1112 includes opposing side walls that are mirrored about a center line. Portions of the sidewalls slope inwardly from opposite directions at an inner acute angle with respect to a plane transverse to a direction that a lift pin 1116 moves reciprocally. In some examples, the ring spacing feature 1112 includes a portion having a "V" shape in one plane as shown, two orthogonal planes or more planes pivoting around the center dotted line. In other examples, the ring spacing feature 1112 includes a portion having a cone shape.

While planar sidewalls are shown, the sidewalls can be planar, partially planar and partially curved, and/or fully curved with varying profiles. As shown in FIG. 11B, a ring portion 1110 includes a ring spacing feature 1120 located on a lower surface thereof. The ring spacing feature 1120 includes opposing side walls that are curved and that are mirrored about a center line.

Figure 11:
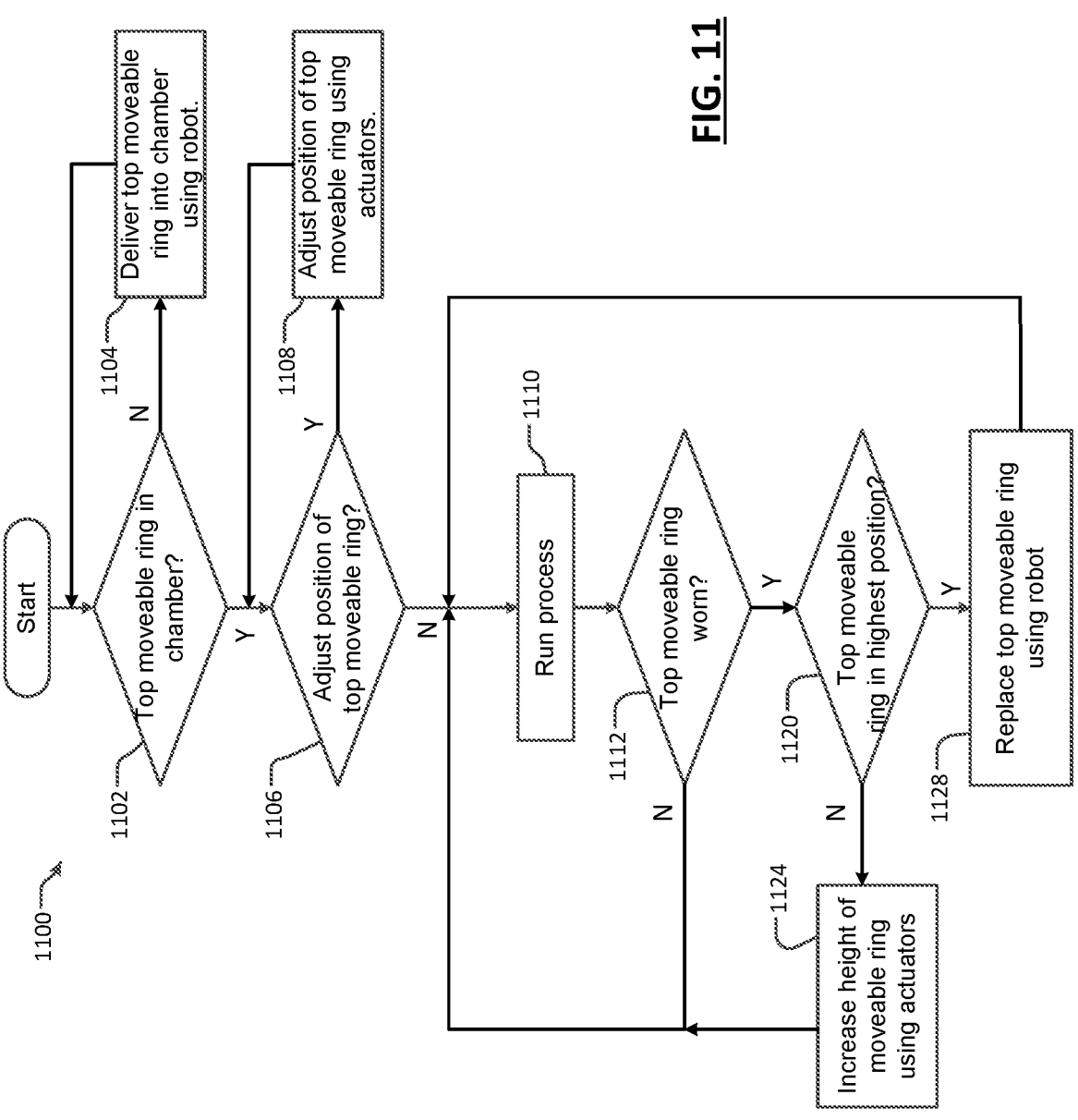
FIG. 11 is a flowchart of an example of a method for adjusting a height of the edge ring according to certain embodiments of the present disclosure.

Referring now to FIG. 11, a method 1100 for adjusting a height of the top moveable ring is shown. In some embodiments, the top moveable ring can be delivered and removed from the processing chamber though a port in the processing chamber without breaking vacuum. In other words, the top moveable edge ring has a diameter less than a width of the port. Once delivered, a height of the top moveable edge ring can be increased over time to compensate for wear caused by exposure to plasma without breaking vacuum. As a result, the processing chamber can be operated for longer periods without opening the processing chamber, which increased throughput and reduces cost.

The method 1100 includes determining whether the top moveable edge ring is in the processing chamber at 1102. If 1102 is false, the method delivers the top moveable ring to the processing chamber at 1104. For example, the system controller 180 causes the robot 190 to deliver the top moveable ring to the processing chamber. If 1102 is true, the method determines whether the position of the top moveable ring needs to be adjusted. For example, one or more sensors may be used to detect a position, height or tilt of the top moveable ring. One or more of the actuators 192 may be used to adjust the position, height or tilt of the top moveable ring relative to an upper surface of the substrate. If 1106 is true, the position of the top moveable ring is adjusted at 1108.

At 1110, the processing chamber processes one or more substrates. At 1112, the method determines whether the top moveable ring is worn. If 1112 is false, the method returns to 1110. If 1112 is true and the top moveable ring is worn, the method determines whether the top moveable ring is in a predetermined position such as a highest position suitable for plasma processing of substrates at 1120. If 1120 is false, the top moveable ring is raised at 1124 and the method continues at 1110. If 1120 is true, the system controller causes the robot to replace the top moveable ring. In some examples, the steps 1106 and 1108 are omitted.

The determination of whether the top moveable edge ring is worn can be made using one or more methods. In certain embodiments, the top moveable edge ring is raised after a predetermined period of exposure to plasma, a predetermined number of substrates are processed, and/or other criteria. In other examples, the sensors 196 are used to sense a height of an upper surface of the top moveable ring.

Figure 12:
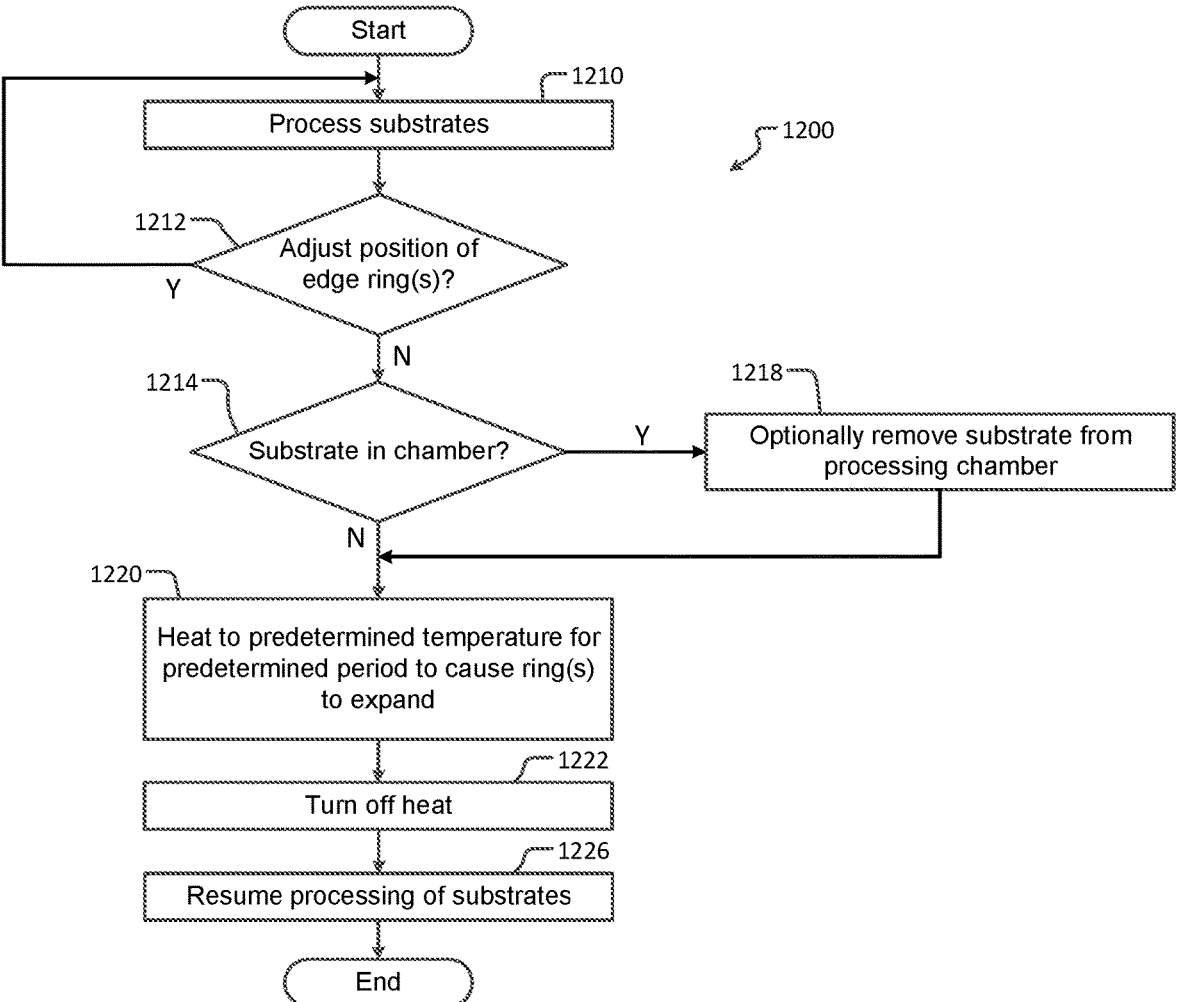
FIG. 12 is a flowchart of an example of a method for heating one or more edge rings to reposition or center the edge rings according to certain embodiments of the present disclosure.

Referring now to FIG. 12, a method 1200 for heating one or more edge rings to reposition or center the edge rings can be used. As the rings, baseplate or other components are heated periodically, on an event basis or using other criteria, the rings, baseplate or other components expand radially outwardly. The radial outward movement can be used directly or indirectly to center or otherwise horizontally position the top moveable ring or other rings.

At 1210, substrates are processed in the processing chamber. At 1212, the method determines whether it is time to adjust a position of the rings or other components. If 1212 is true, the method returns to 1210. If 1212 is false, the method may optionally determine whether a substrate is in the processing chamber at 1214. If 1214 is true, the method may optionally remove the substrate at 1218. For example, the substrate may be removed if the desired heating temperature exceeds a thermal budget for the substrate.

At 1220, if 1214 is false, the heating layer (or other heater in the substrate support or other component) is heated to a predetermined temperature to cause the rings, baseplate or other components to expand and center one or more rings. The rings, baseplate or other components expand radially outwardly. The radial outward movement can be used to center or otherwise position the top moveable ring or other rings in the edge ring system. After the predetermined period, the heater is turned off at 1222 and processing of substrates can resume at 1226.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C." As used herein, the term "about" means+/−10% of a given value and/or +/−5% of a given percentage.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A moveable edge ring system for a substrate processing system, comprising:

a top moveable ring including a first annular body arranged around a substrate support, wherein the top moveable ring includes a first annular recess on an upper and radially outer surface of the first annular body, and wherein the top moveable ring comprises conductive material and is exposed to plasma during substrate processing;

a moveable support ring arranged below the top moveable ring and radially outside of a baseplate of the substrate support and including a second annular body; and a shield ring arranged radially outside of the moveable support ring and including a third annular body;

a cover ring including a fourth annular body arranged above a radially outer edge of the top moveable ring, wherein the cover ring includes a second annular recess configured to align with the first annular recess of the top moveable ring when the top moveable ring and the moveable support ring are raised; and an actuator and a lift pin configured to adjust a position of the top moveable ring and the moveable support ring relative to the shield ring and the cover ring.

2. The moveable edge ring system of claim 1, wherein:

the shield ring includes a projection extending upwardly from an upper and radially outer surface of the third annular body; and the cover ring includes:

a third annular recess configured to receive the projection.

3. The moveable edge ring system of claim 1, wherein the top moveable ring, the moveable support ring and the shield ring are conductive, and the cover ring is nonconductive.

4. The moveable edge ring system of claim 3, wherein as the top moveable ring and the moveable support ring are moved from a lowest position to intermediate positions and to an uppermost position, the moveable support ring maintains:

greater than or equal to 70% of vertical side portions of a radially outer surface of the moveable support ring within a first predetermined coupling gap of the shield ring; and greater than or equal to 50% of vertical side portions of a radially inner surface of the moveable support ring are located within a second predetermined coupling gap of the baseplate, wherein the first predetermined coupling gap is greater than zero and less than or equal to 20 mils.

5. The moveable edge ring system of claim 3, wherein as the top moveable ring and the moveable support ring are moved from a lowest position to intermediate positions and to an uppermost position, the moveable support ring maintains:

greater than or equal to 90% of vertical side portions of a radially outer surface of the moveable support ring within a first predetermined coupling gap of the shield ring; and greater than or equal to 60% of vertical side portions of a radially inner surface of the moveable support ring are located within a second predetermined coupling gap of the baseplate, wherein the first predetermined coupling gap is greater than zero and less than or equal to 20 mils.

6. The moveable edge ring system of claim 1, further comprising an edge ring including a fifth annular body having an "L"-shaped cross-section, wherein the substrate support includes a heating layer arranged on the baseplate, and wherein the edge ring is arranged between the heating layer of the substrate support and radially inner sides of the top moveable ring and the moveable support ring.

7. The moveable edge ring system of claim 6, wherein the top moveable ring, the moveable support ring and the shield ring are conductive, and the cover ring and the edge ring are nonconductive.

8. The moveable edge ring system of claim 1, further comprising an edge ring including a fifth annular body and arranged radially outside of the shield ring and the cover ring, wherein the top moveable ring, the moveable support ring and the shield ring are conductive and the cover ring and the edge ring are nonconductive.

9. The moveable edge ring system of claim 8, wherein the edge ring includes an annular recess on an upper and radially inner surface thereof to receive the cover ring.

10. The moveable edge ring system of claim 1, wherein a lower surface of the moveable support ring includes a ring centering portion to center the moveable support ring in response to the lift pin biasing the ring centering portion.

11. The moveable edge ring system of claim 1, wherein a lower surface of the top moveable ring includes a ring centering portion to center the top moveable ring in response to the moveable support ring biasing the ring centering portion of the top moveable ring.

12. The moveable edge ring system of claim 1, wherein at least one of the top moveable ring, the moveable support ring and the shield ring includes a horizontal ring spacer.

13. The moveable edge ring system of claim 12, wherein the horizontal ring spacer includes at least one of a shim, a projection and a pin.

14. A system comprising:

the moveable edge ring system of claim 1;

the substrate support configured to support a substrate; and a controller configured to control the actuator to move the lift pin to adjust a height of the moveable support ring and the top moveable ring relative to the substrate support.

15. The system of claim 14, wherein the controller is configured to adjust the height of the moveable support ring and the top moveable ring in response to at least one of a number of RF plasma cycles, a number of substrates processed and a period of a RF exposure.

16. An edge ring system for a substrate processing system, comprising:

a top stationary ring including a first annular body that comprises conductive material and that is directly exposed to plasma during substrate processing;

a moveable ring arranged below the top stationary ring and radially outside of a baseplate of a substrate support and including a second annular body;

a shield ring arranged below and radially outside of the moveable ring and including a third annular body; and an actuator and lift pin configured to adjust a position of the moveable ring relative to the top stationary ring and the shield ring.

17. The edge ring system of claim 16, further comprising a cover ring that is nonconductive and that is arranged above a radially outer edge of the top stationary ring.

18. The edge ring system of claim 17, wherein the top stationary ring includes a first annular recess on an upper and radially outer surface of the first annular body.

19. The edge ring system of claim 18, wherein:

the shield ring includes a projection extending upwardly from an upper and radially outer surface of the third annular body; and the cover ring includes:

a second annular recess configured to receive the projection; and a third annular recess configured to mate with the first annular recess of the top stationary ring.

20. The edge ring system of claim 19, further comprising an edge ring including an annular body and arranged radially outside of the shield ring.

21. The edge ring system of claim 20, wherein the edge ring includes an annular recess on an upper and radially inner surface thereof to receive the cover ring, wherein the top stationary ring, the moveable ring and the shield ring are conductive and the cover ring and the edge ring are non-conductive.

22. The edge ring system of claim 17, further comprising an inner ring including a fourth annular body, wherein the substrate support includes a heating layer arranged on the baseplate, and wherein the inner ring is arranged between the heating layer of the substrate support and a radially inner surface of the top stationary ring when the moveable ring is in a lowered position.

23. The edge ring system of claim 22, wherein the top stationary ring, the moveable ring and the shield ring are conductive, and the cover ring is nonconductive.

24. The edge ring system of claim 16, wherein the moveable ring and the shield ring are made of conductive material.

25. The edge ring system of claim 24, wherein as the moveable ring is moved from a lowest position to interme-diate positions and to an uppermost position, the moveable ring maintains:

greater than or equal to 70% of vertical side portions of a radially outer surface of the moveable ring within a first predetermined coupling gap of the shield ring; and greater than or equal to 50% of vertical side portions of a radially inner surface of the moveable ring within a second predetermined coupling gap of the baseplate, wherein the first predetermined coupling gap is less than or equal to 30 mils.

26. The edge ring system of claim 24, wherein the moveable ring has a "T"-shaped cross-section and the shield ring has an inverted "T"-shaped cross-section.

27. The edge ring system of claim 16, wherein the top stationary ring includes a radially inner planar portion, a radially outer planar portion, and an upwardly sloped por-tion extending from the radially inner planar portion to the radially outer planar portion.

28. The edge ring system of claim 27, wherein the moveable ring includes a radially inwardly projecting por-tion and a radially outwardly projecting portion, and wherein an upper and radially inner surface of the radially inwardly projecting portion includes a sloped portion.

29. The edge ring system of claim 28, wherein an upper surface of the sloped portion extends parallel to a lower surface of the upwardly sloped portion.

30. The edge ring system of claim 16, wherein a lower surface of the moveable ring includes a ring centering portion to center the moveable ring in response to the lift pin biasing the ring centering portion of the moveable ring.

31. The edge ring system of claim 16, wherein at least one of the top stationary ring, the moveable ring and the shield ring includes a horizontal ring spacer.

32. The edge ring system of claim 31, wherein the horizontal ring spacer includes at least one of a shim, a projection and a pin.

33. A system comprising:
the edge ring system of claim 16;
the substrate support configured to support a substrate; and a controller configured to adjust a height of the actuator to move the lift pin to adjust a height of the moveable ring relative to the top stationary ring.

34. The system of claim 33, wherein the controller is configured to adjust the height of the moveable ring in response to at least one of a number of RF plasma cycles, a number of substrates processed and a period of a RF exposure.

35. A substrate processing system, comprising:
a substrate support including a cylindrical body, an annu-lar projecting portion extending from a lower portion of the cylindrical body, and a shield portion extending upwardly from a radially outer edge of the annular projecting portion, wherein a cavity is defined between the cylindrical body and the shield portion;

a top moveable ring including a first annular body arranged around the substrate support, wherein the top moveable ring comprises conductive material and is exposed to plasma during substrate processing, and wherein the top moveable ring includes a first annular recess on an upper and radially outer surface of the first annular body;

a moveable support ring including a second annular body, wherein the moveable support ring is arranged below the top moveable ring in the cavity between the shield portion and the cylindrical body; and a cover ring including a third annular body arranged above a radially outer edge of the top moveable ring, wherein the cover ring includes a second annular recess on a lower and radially inner surface of the third annular body configured to align with the first annular recess of the top moveable ring when the top moveable ring and the moveable support ring are raised using an actuator and a lift pin.

36. The substrate processing system of claim 35, further comprising:
the actuator and the lift pin configured to adjust a position of the top moveable ring and the moveable support ring relative to the shield portion and the cover ring.

37. The substrate processing system of claim 35, wherein the top moveable ring, the cylindrical body, the moveable support ring and the shield portion are conductive, and the cover ring is nonconductive.

38. The substrate processing system of claim 35, wherein as the top moveable ring and the moveable support ring are moved from a lowest position to intermediate positions and to an uppermost position, the moveable support ring main-tains:

greater than or equal to 70% of vertical side portions of a radially inner surface of the moveable support ring within a first predetermined coupling gap of the cylin-drical body; and greater than or equal to 50% of vertical side portions of a radially outer surface of the moveable support ring are located within a second predetermined coupling gap of the shield portion, wherein the first predetermined coupling gap is greater than zero and less than or equal to 20 mils.

39. The substrate processing system of claim 35, wherein a lower surface of the moveable support ring includes a ring centering portion to center the moveable support ring rela-tive to the cylindrical body in response to the lift pin biasing the ring centering portion of the moveable support ring.

40. The substrate processing system of claim 35, wherein at least one of the top moveable ring, and the moveable support ring includes a horizontal ring spacer.

41. The substrate processing system of claim 40, wherein the horizontal ring spacer includes at least one of a shim, a projection and a pin.

42. The substrate processing system of claim 35, further comprising:

the actuator;

the lift pin; and a controller configured to cause the actuator to move the lift pin to adjust a height of the moveable support ring and the top moveable ring relative to the substrate support.

43. The substrate processing system of claim 42, wherein the controller is configured to adjust the height of the moveable support ring and the top moveable ring in response to at least one of a number of RF plasma cycles, a number of substrates processed and a period of a RF exposure.

44. A moveable edge ring system for a substrate processing system, comprising:

a top moveable ring including a first annular body arranged around a substrate support, wherein an upper surface of the top moveable ring comprises conductive material and is exposed to plasma during substrate processing;

a moveable support ring arranged below the top moveable ring and radially outside of a baseplate of the substrate support and including a second annular body; and a shield ring arranged below and radially outside of the moveable support ring and including a third annular body; and an actuator and lift pin configured to adjust a position of the top moveable ring and the moveable support ring relative to the shield ring, wherein the top moveable ring, the moveable support ring and the shield ring are made of conductive material, and wherein as the top moveable ring and the moveable support ring are moved from a lowest position to intermediate positions and to an uppermost position, the moveable support ring maintains:

greater than or equal to 70% of vertical side portions of a radially outer surface of the moveable support ring within a first predetermined coupling gap of the shield ring; and greater than or equal to 50% of vertical side portions of a radially inner surface of the moveable support ring within a second predetermined coupling gap of the baseplate, wherein the first predetermined coupling gap is greater than zero and less than or equal to 20 mils.

45. The moveable edge ring system of claim 44, wherein the first predetermined coupling gap is greater than zero and less than or equal to 10 mils.

\* \* \* \* \*